United States Patent
Cha et al.

(10) Patent No.: US 10,613,931 B2
(45) Date of Patent: Apr. 7, 2020

(54) MEMORY DEVICES

(71) Applicant: Samsung Electronics Co., Ltd., Suwon-si, Gyeonggi-do (KR)

(72) Inventors: Jeong Yun Cha, Asan-si (KR); June Hyun Park, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/030,025

(22) Filed: Jul. 9, 2018

(65) Prior Publication Data

US 2019/0220352 A1 Jul. 18, 2019

(30) Foreign Application Priority Data

Jan. 15, 2018 (KR) ........................ 10-2018-0005082

(51) Int. Cl.
*G06F 11/00* (2006.01)
*G11C 29/52* (2006.01)
(Continued)

(52) U.S. Cl.
CPC ........ *G06F 11/1068* (2013.01); *G06F 3/0619* (2013.01); *G06F 3/0659* (2013.01); *G06F 3/0673* (2013.01); *G11C 29/1201* (2013.01); *G11C 29/42* (2013.01); *G11C 29/48* (2013.01); *G11C 29/52* (2013.01); *G11C 29/56004* (2013.01); *G11C 29/56012* (2013.01); *G11C 11/409* (2013.01); *G11C 2029/0403* (2013.01);
(Continued)

(58) Field of Classification Search
CPC .. G06F 11/1068; G06F 3/0619; G06F 3/0659; G06F 3/0673; G11C 29/52; G11C 11/409
See application file for complete search history.

(56) References Cited

U.S. PATENT DOCUMENTS 6,421,292 B1 7/2002 Kitamoto et al.
7,032,142 B2 * 4/2006 Fujioka ................ G06F 11/106
365/200

(Continued)

FOREIGN PATENT DOCUMENTS

JP 5353681 B2 11/2013
KR 100460708 B1 11/2004
(Continued)

*Primary Examiner* — Kyle Vallecillo
(74) *Attorney, Agent, or Firm* — Harness, Dickey & Pierce, P.L.L.C.

(57) ABSTRACT

A memory device includes memory banks that each include a bank array having memory cells, a row decoder, and a column decoder. Each memory cell includes a capacitor and a transistor, a write circuit to store input data received at the memory device from a test device in the bank array, a read circuit to generate output data based on reading data stored in the bank array, a parity data management circuit to generate first parity data smaller than the input data using the input data, generate second parity data smaller than the output data using the output data, and generate third parity data using the first and second parity data, and an output circuit to output at least one of the first, second, and third parity data as verification data, in response to receipt of a request from the test device at the memory device.

20 Claims, 20 Drawing Sheets

(51) Int. Cl.
  *G06F 3/06*      (2006.01)
  *G06F 11/10*     (2006.01)
  *G11C 29/12*     (2006.01)
  *G11C 29/42*     (2006.01)
  *G11C 29/56*     (2006.01)
  *G11C 29/48*     (2006.01)
  *G11C 11/409*    (2006.01)
  *G11C 29/04*     (2006.01)
  *G11C 29/40*     (2006.01)
  *G11C 29/44*     (2006.01)

(52) U.S. Cl.
  CPC ........ *G11C 2029/4002* (2013.01); *G11C 2029/4402* (2013.01); *G11C 2029/5602* (2013.01)

(56) References Cited

U.S. PATENT DOCUMENTS

| | | | |
|---|---|---|---|
| 7,212,453 B2 * | 5/2007 | Kikutake | G06F 11/1032 365/189.08 |
| 7,298,188 B2 | 11/2007 | Kawasaki | |
| 7,325,173 B2 | 1/2008 | Kikutake et al. | |
| 7,539,921 B2 | 5/2009 | Regev et al. | |
| 8,001,450 B2 | 8/2011 | Onishi et al. | |
| 8,136,017 B2 | 3/2012 | Oh et al. | |
| 8,381,064 B2 | 2/2013 | Hazelzet | |
| 9,235,466 B2 | 1/2016 | Sohn et al. | |
| 9,583,215 B2 | 2/2017 | Jeong et al. | |
| 2008/0313525 A1 * | 12/2008 | Baker | G06F 11/1072 714/758 |
| 2009/0153176 A1 | 6/2009 | Inaba | |
| 2014/0157082 A1 * | 6/2014 | Kim | G06F 11/1012 714/763 |
| 2016/0155515 A1 * | 6/2016 | Son | G11C 29/4401 714/719 |
| 2016/0189800 A1 * | 6/2016 | Ryu | G11C 29/76 365/96 |
| 2016/0217030 A1 * | 7/2016 | Shin | G06F 11/085 |
| 2016/0357630 A1 * | 12/2016 | Kang | G11C 5/025 |
| 2016/0378597 A1 * | 12/2016 | Chung | G11C 29/52 714/764 |
| 2017/0070240 A1 | 3/2017 | Kim | |
| 2017/0075757 A1 | 3/2017 | Im et al. | |
| 2017/0287544 A1 * | 10/2017 | Hedden | G11C 11/406 |
| 2019/0115937 A1 * | 4/2019 | Lee | G06F 11/073 |

FOREIGN PATENT DOCUMENTS

| | | |
|---|---|---|
| KR | 100864035 B1 | 10/2008 |
| KR | 100901404 B1 | 6/2009 |

* cited by examiner

MEMORY DEVICES

CROSS-REFERENCE TO RELATED APPLICATIONS

This application claims benefit of priority, under 35 U.S.C. § 119, to Korean Patent Application No. 10-2018-0005082 filed on Jan. 15, 2018 in the Korean Intellectual Property Office, the disclosure of which is incorporated herein by reference in its entirety.

BACKGROUND

1. Field

The present inventive concepts relate to memory devices.

2. Description of Related Art

A memory device is a device configured to store and output data. Memory devices may be applied to (included in) devices within various fields. In recent years, in addition to computer devices to which memory devices are generally applied, memory devices have been widely applied to household appliances, Internet of Things products, vehicles, and medical devices. Therefore, it is important to improve productivity in the production of memory devices. Memory devices may be manufactured through a manufacturing process and a test process for verifying a manufactured memory device. Particularly, in a test process, it is important to accurately test a large number of memory devices in as short a time as possible.

SUMMARY

An aspect of the present inventive concepts is to provide a memory device allowing for efficiency of a test process to be significantly increased, using an error detection and correction function, embedded in the memory device.

According to some example embodiments of the present inventive concepts, a memory device may include a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor, a write circuit configured to store input data received at the memory device from a test device in the bank array, a read circuit configured to generate output data based on reading data stored in the bank array, a parity data management circuit configured to generate first parity data using the input data, the first parity data having a size smaller than the input data, generate second parity data using the output data, the second parity data having a size smaller than the output data, and generate third parity data using the first parity data and the second parity data, and an output circuit configured to output at least one instance of data of the first parity data, the second parity data, and the third parity data as verification data, in response to a receipt of a request from the test device at the memory device.

According to some example embodiments of the present inventive concepts, a memory device may include an input/output bus configured to provide a transmission path of data, and a plurality of memory chips configured to share the input/output bus. Each memory chip of the plurality of memory chips may include a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor, a write circuit configured to store input data received at the memory chip from a test device through the input/output bus in the bank array, a read circuit configured to generate output data based on reading data stored in the bank array, a parity data management circuit configured to generate first parity data using the input data, the first parity data having a size smaller than the input data, generate second parity data using the output data, the second parity data having a size smaller than the output data, and generate third parity data using the first parity data and the second parity data, and an output circuit configured to output at least one instance of data of the first parity data, the second parity data, and the third parity data as verification data, in response to a receipt of a request from the test device at the memory chip. One memory chip of the plurality of memory chips may be configured to output the verification data concurrently with a remaining plurality of memory chips of the plurality of memory chips outputting a high impedance signal.

According to some example embodiments of the present inventive concepts, a memory device may include an input/output bus configured to provide a transmission path of data, and a plurality of memory chips configured to share the input/output bus. Each memory chip of the plurality of memory chips may include a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor, a write circuit configured to receive input data having $2^N$ bits, where N is a natural number, through the input/output bus and store the input data in the bank array, a read circuit configured to generate output data having $2^N$ bits based on reading data stored in the bank array, a parity data management circuit configured to generate first parity data having N+1 bits using the input data, generate second parity data having N+1 bits using the output data, and generate third parity data having N+1 bits using the first parity data and the second parity data, and an output circuit configured to output at least one instance of data of the first parity data, the second parity data, and the third parity data as verification data, in response to a receipt of a request from the test device at the memory chip. A total quantity of bits of the verification data, output by the plurality of memory chips in response to a request from the test device being received at the plurality of memory chips, may be smaller than a quantity of bits defined by a burst size of the plurality of memory chips.

BRIEF DESCRIPTION OF DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims.

The accompanying drawings are not to be considered as drawn to scale unless explicitly noted.

DETAILED DESCRIPTION

Hereinafter, some example embodiments of the present disclosure will be described in detail with reference to the accompanying drawings.

Figure 1:
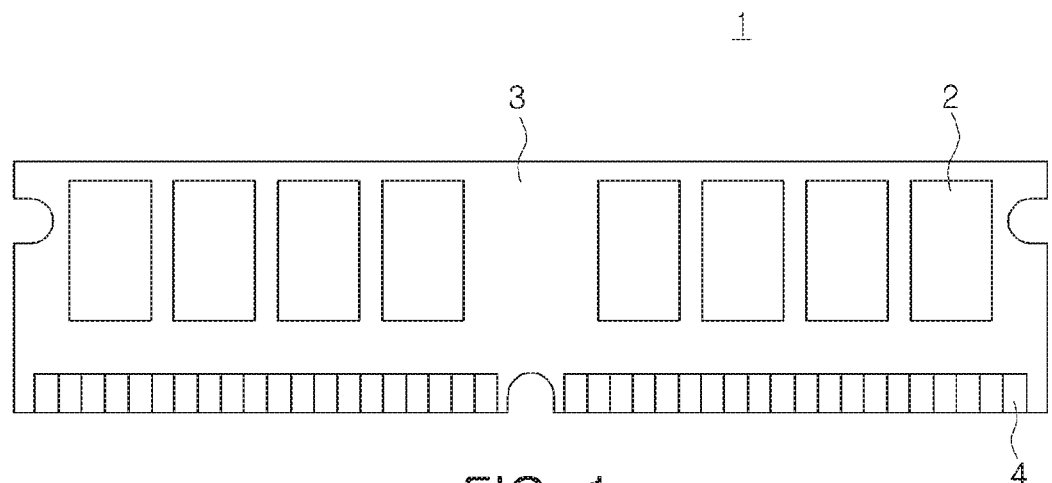
FIG. 1 is a view illustrating a memory module according to some example embodiments of the inventive concepts.

FIG. 1 is a view illustrating a memory module according to some example embodiments of the inventive concepts.

Referring to FIG. 1, a memory module 1 according to some example embodiments of the inventive concepts may include a plurality of memory chips 2, a substrate 3 on which the plurality of memory chips 2 are mounted, and the like. Input/output pins 4 for transmitting and receiving data may be provided at one edge of the substrate 3. The plurality of memory chips 2 may receive data through the input/output pins 4 and store the data, or may output data through the input/output pins 4. In FIG. 1, a single memory module 1 is illustrated as including eight memory chips 2, but the number of memory chips 2 may vary, depending on data storage capacity to be provided by the memory module 1, data storage capacity of each of the memory chips 2, or the like. An input/output bus, connecting the memory chips 2 to the input/output pins 4, may be provided in the substrate 3, and the memory chips 2 may share the input/output bus.

Meanwhile, in some example embodiments of the inventive concepts, a plurality of memory chips may be provided in the form of a memory package. When the plurality of memory chips are included in a single package, input/output pins, formed in the package, may be shared by the plurality of memory chips. In some example embodiments of the inventive concepts, the plurality of memory chips are stacked on a package substrate, and the plurality of memory chips, having been stacked, are sealed, so a memory package may be provided.

Figure 2:
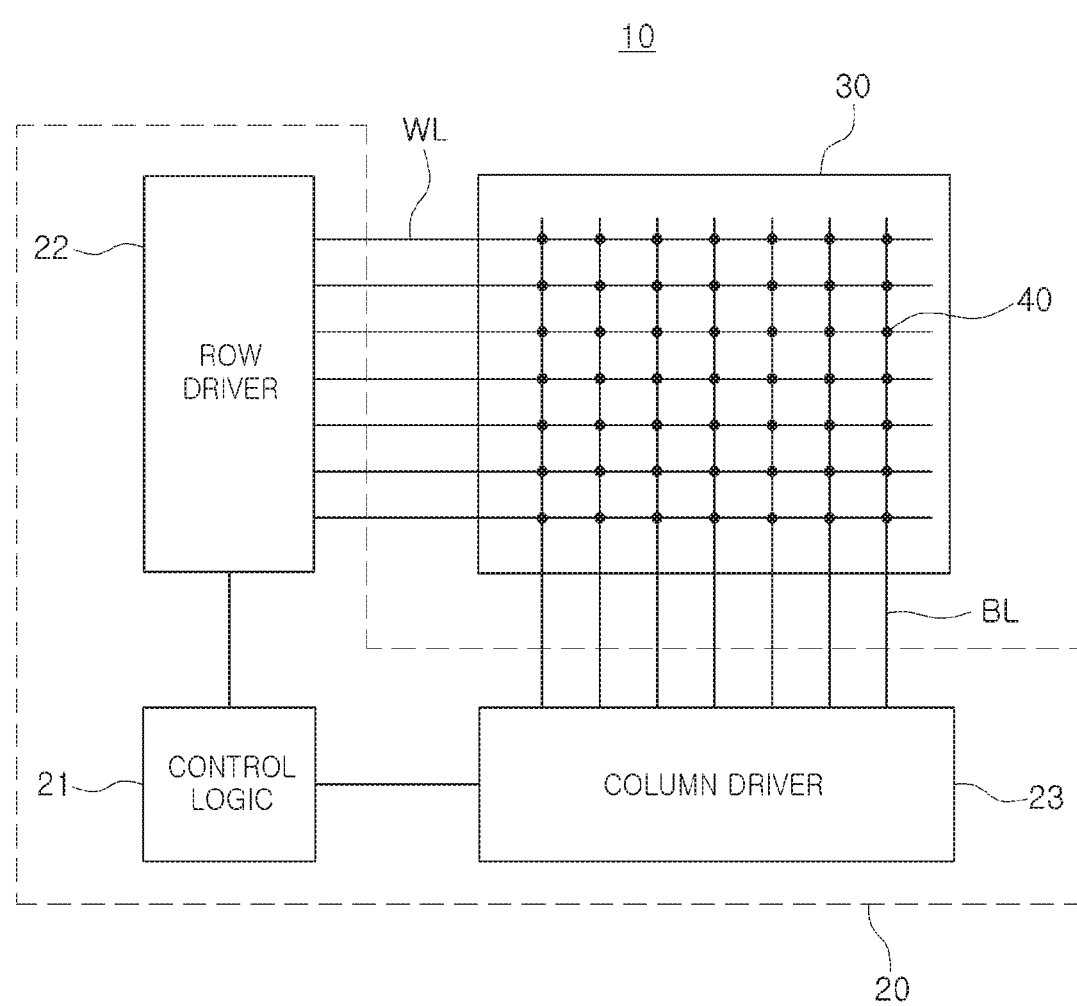
FIG. 2 is a schematic block diagram illustrating a memory device according to some example embodiments of the inventive concepts.

FIG. 2 is a schematic block diagram illustrating an internal structure of a memory device 10. The memory device 10 according to some example embodiments of the inventive concepts, illustrated in FIG. 2, may be employed as a plurality of memory chips 2, included in the memory module 1 in some example embodiments of the inventive concepts illustrated in FIG. 1. Referring to FIG. 2, the memory device 10 according to some example embodiments of the inventive concepts may include a memory controller 20 and a bank array 30. In some example embodiments, the memory controller 20 may include a control logic 21 (also referred to herein as a "control logic circuit"), a row driver 22 (also referred to herein as a "row driver circuit"), a column driver 23 (also referred to herein as a "column driver circuit"), and the like. It will be understood that the control logic 21, the row driver 22, and the column driver 23 as shown in at least FIG. 2 refer to the known instances of circuitry that are commonly known as "control logic," "row driver," and "column driver," respectively, in the field of semiconductor memory devices, including dynamic random-access memory (DRAM). The bank array 30 may include a plurality of memory cells 40.

In some example embodiments, the row driver 22 may be connected to memory cells 40 through a word line WL, while the column driver 23 may be connected to the memory cells 40 through a bit line BL. In some example embodiments, the row driver 22 may include an address decoder for selecting the memory cell MC to write data to or to read data from, while the column driver 23 may include a read/write circuit to write data to the memory cell MC, or to read data from the memory cell MC. Operations of the row driver 22 and the column driver 23 may be controlled by the control logic 21.

Figure 3:
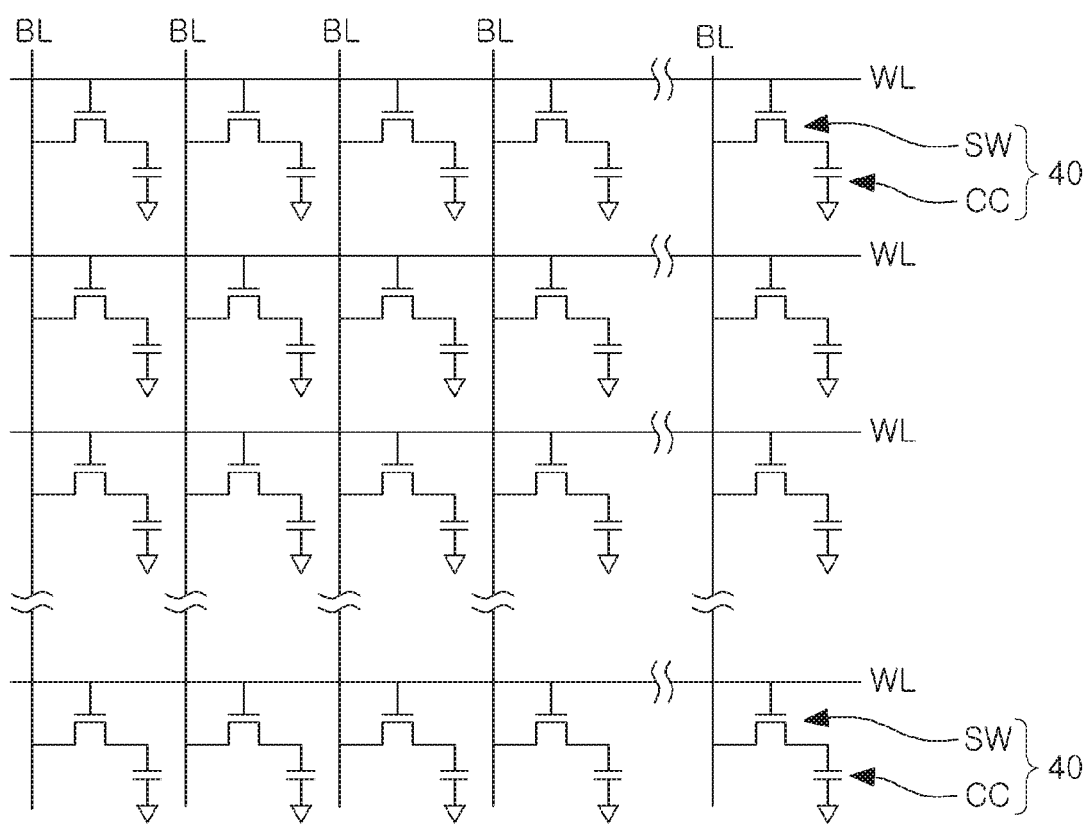
FIG. 3 is a view illustrating a bank array included in a memory device according to some example embodiments of the inventive concepts.

FIG. 3 is a view illustrating a bank array included in a memory device according to some example embodiments.

Referring to FIG. 3, a bank array 30 according to some example embodiments of the inventive concepts may include a plurality of memory cells 40. The memory cells 40 may be provided at points at which the plurality of word lines WL and a plurality of bit lines BL intersect. In other words, each of the memory cells 40 may be connected to a single word line WL and a single bit line BL.

Each of the memory cells 40 may include a switch device SW and an information storage capacitor CC. In some example embodiments of the inventive concepts, the switch device SW may include a transistor, a gate terminal of the transistor may be connected to the word line WL, and respective drain/source terminals of the transistor may be connected to the bit line BL and the information storage capacitor CC.

The memory controller 20 may charge a charge in the information storage capacitor CC, included in each of the plurality of memory cells 40, or may discharge a charge, charged in the information storage capacitor CC, through a plurality of word lines WL and a plurality of bit lines BL, to write or erase data. Moreover, the memory controller 20 may read a voltage of the information storage capacitor CC, or the like, thereby reading data from each of the plurality of memory cells 40. In some example embodiments of the inventive concepts, the memory controller 20 may perform a refresh operation for re-writing data on a plurality of memory cells 40, in order to reduce and/or prevent a charge, charged in the information storage capacitor CC, from being lost by natural discharge.

Figure 4:
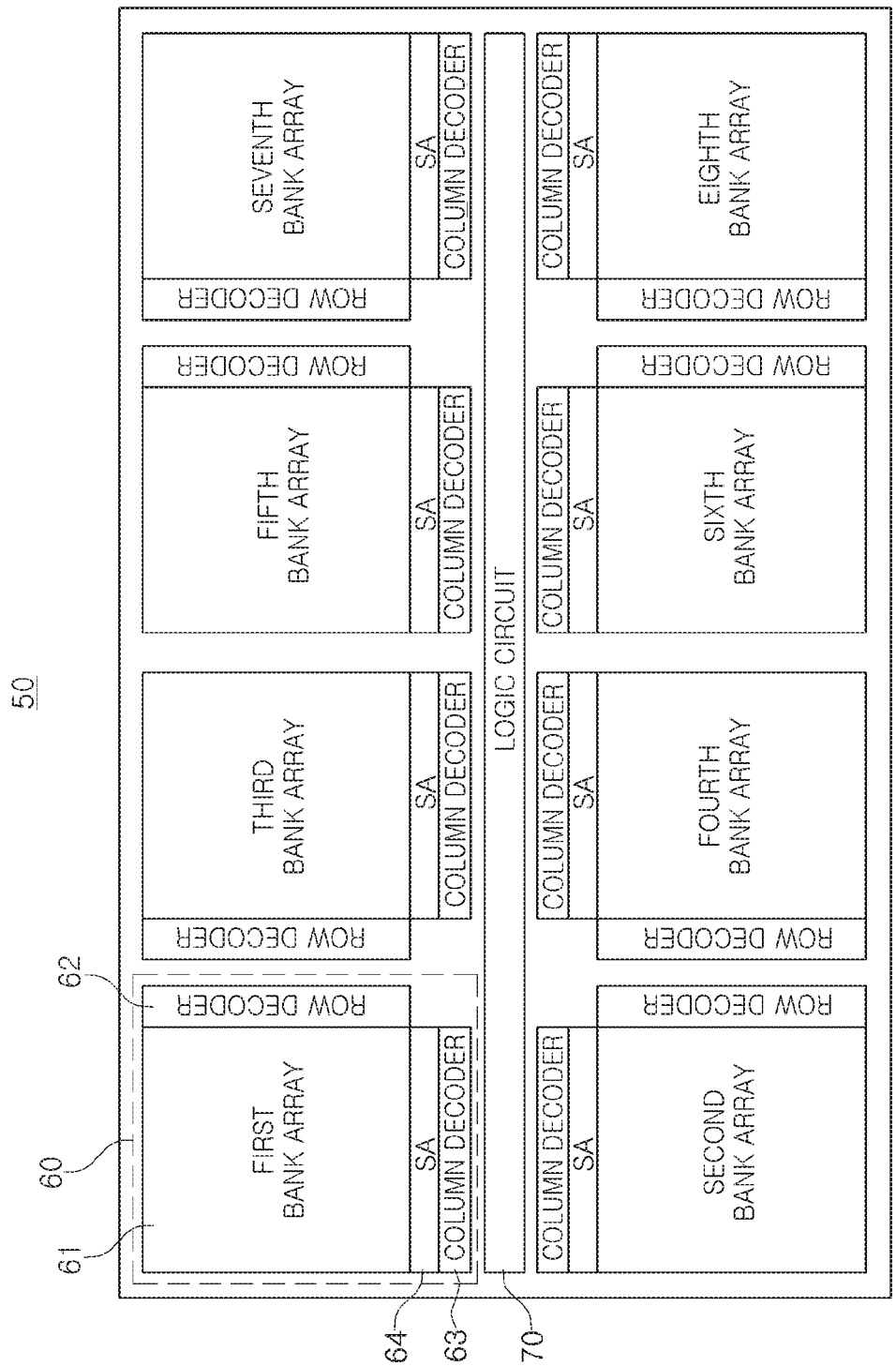
FIG. 4 is a schematic view illustrating a structure of a memory device included in a memory module according to some example embodiments of the inventive concepts.

FIG. 4 is a schematic view illustrating a structure of a memory device included in a memory module according to some example embodiments of the inventive concepts.

Referring to FIG. 4, the memory device 50 according to some example embodiments of the inventive concepts may include a memory bank 60 and a logic circuit 70. The memory bank 60 may include a bank array 61 having a plurality of memory cells, a row decoder 62, a column decoder 63, a sense amplifier 64, and the like. In some example embodiments of the inventive concepts, the memory device 50 may include the memory banks 60, provided as a plurality of memory banks.

The plurality of memory banks 60, included in the memory device 50, may share a single logic circuit 70. The logic circuit 70 may designate an address for reading data from the bank array 61 or for storing data in the bank array 61, or may determine an operation mode of the memory device 50. Moreover, the logic circuit 70 may include an input/output pad for transmitting data to be stored in a plurality of memory banks 60 and data output by a plurality of memory banks 60.

Figure 5:
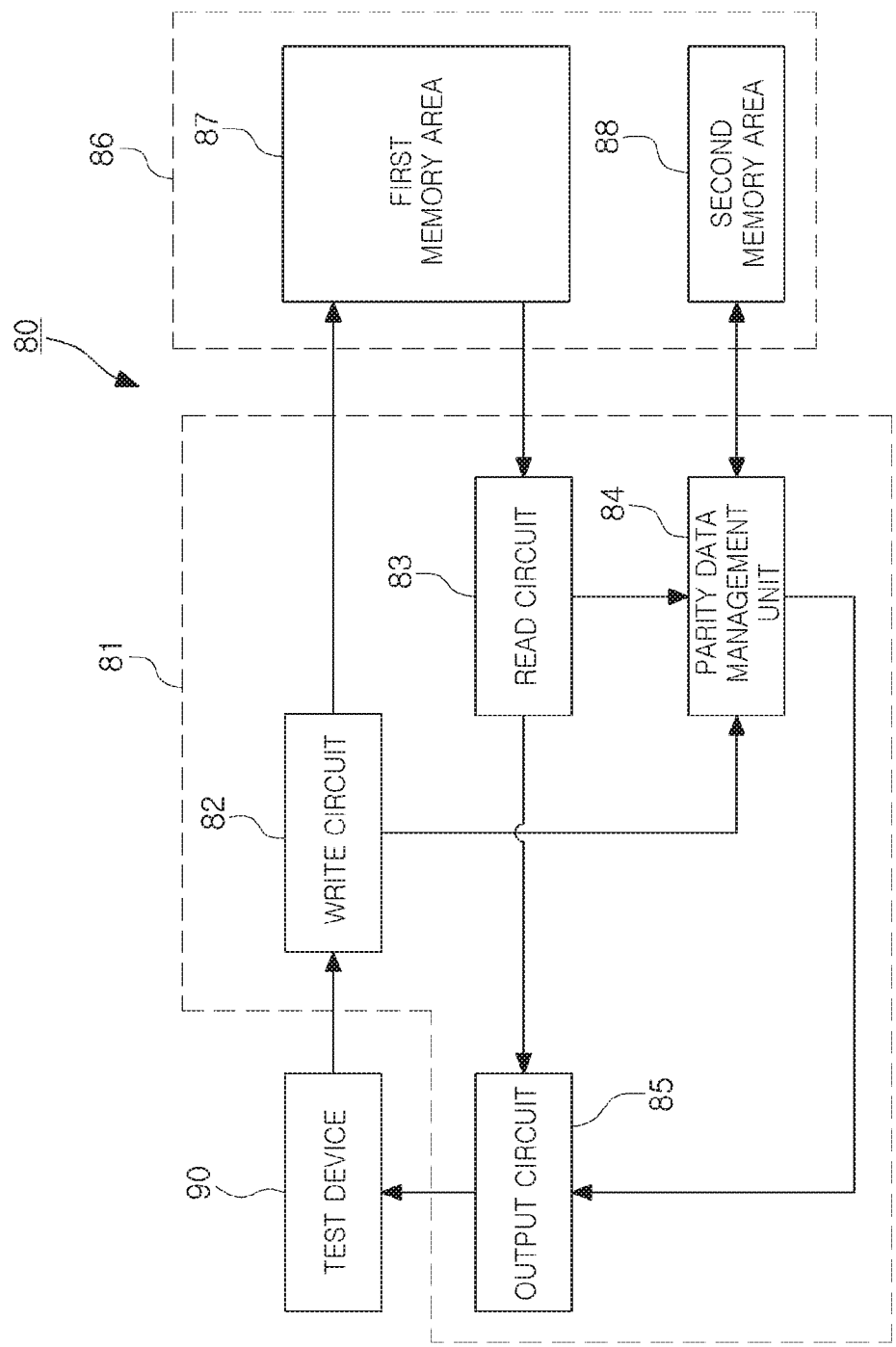
FIG. 5 is a schematic block diagram illustrating a memory device according to some example embodiments of the inventive concepts.

FIG. 5 is a schematic block diagram illustrating a memory device according to some example embodiments of the inventive concepts.

Referring to FIG. 5, the memory device 80 according to some example embodiments of the inventive concepts may include a memory controller 81 and a memory area 86 (also referred to herein as a "memory area of memory cells"). The memory controller 81 may store data in the memory area 86, may read data stored in the memory area 86, or may delete data stored in the memory area 86. The memory device 80 according to some example embodiments of the inventive concepts, illustrated in FIG. 5, may correspond to the memory chip 2, included in the memory module 1 illustrated in FIG. 1.

When the memory device 80 is manufactured through a manufacturing process, a test device 90 is connected to the memory device 80, and a particular (or, alternatively, predetermined) test process may be performed. In some example embodiments of the inventive concepts, the test device 90 may perform a test process by transmitting particular (or, alternatively, predetermined) input data to the memory device 80 and controlling the memory device 80 to store the input data therein, and by comparing output data, received from the memory device 80, with the input data. When the input data and the output data do not match with each other, the test device 90 may determine that a failure has occurred in the memory device 80.

The memory area 86 may be provided by (e.g., may be included in) a bank array having a plurality of memory cells, and may include a first memory area 87 (e.g., a first memory area of memory cells) and a second memory area 88 (e.g., a second memory area of memory cells). The first memory area 87 and the second memory area 88 may be areas of memory cells that are physically separated from each other, or may be areas virtually separated by a program executed by the memory controller 81.

The memory controller 81 may include a write circuit 82, a read circuit 83, a parity data management unit 84 (also referred to herein as a "parity data management circuit"), an output circuit 85, and the like. The write circuit 82 may be configured to store data (e.g., input data transmitted by a test device 90 and/or received at the memory device 80 from a test device 90) in the memory area 86, while the read circuit 83 may be configured to read data from the memory area 86. When a test process is performed by the test device 90, the write circuit 82 may store input data, transmitted by the test device 90, in the first memory area 87, and the read circuit 83 may read data stored in the first memory area 87 and generate output data, in response to a request from the test device 90. Restated, the read circuit 83 may be configured to generate output data based on reading data stored in the bank array in which the memory area 86 is included. The read circuit 83 may read the input data stored in the first memory area 87 by the write circuit 82, to generate the output data.

In a process of testing the memory device 80, according to the related art, the test device 90 may generate input data, required for a test process, and transmit the input data to the memory controller 81. The memory controller 81 may store input data from the test device 90 in the memory area 86. When a request for output data is received from the test device 90, the memory controller 81 may read data, stored in the memory area 86, and transmit the data to the test device 90. The test device 90 may determine whether an error has occurred while the memory device 80 stores and outputs data, by comparing the input data with the output data.

When a test process is performed using the method described above, to conduct a single test, the test device 90 may compare the output data, received from the memory device 80, to input data for each bit. In other words, to conduct a test, output data should be received from the memory device 80 as it is, so the time required for a test process may increase, and the efficiency of the test process may be reduced.

In some example embodiments of the inventive concepts, to increase efficiency of the test process, during a process in which a test process is performed, the test device 90 may not compare input data to output data. In some example embodiments of the inventive concepts, the test device 90 may generate input data and transmit the input data to the memory device 80. Moreover, an engineer may directly programmatically define reference data to the test device 90, in consideration of input data. The reference data may have a size smaller than the input data. In some example embodiments of the inventive concepts, when the input data has $2^N$ bits, the reference data may have N+1 bits, wherein N is a natural number.

The memory device 80 may output verification data to the test device 90 to allow the test device 90 to perform a test process. The test device 90 compares reference data with verification data, thereby determining whether an error has occurred during an operation in which the memory device 80 stores data in the memory area 86 or reads data from the memory area 86. The verification data may have a size smaller than output data. Thus, during the same time, a test process with respect to a greater number of memory devices 80 is performed, so the efficiency of a test process may be improved. In some example embodiments of the inventive concepts, reference data may be generated by the parity data management unit 84 included in the memory controller 81.

When the test device 90 generates test data and transmits the test data to the memory controller 81 as input data, the write circuit 82 may store the input data in the first memory area 87. The parity data management unit 84 may be configured to generate first parity data using the input data which the write circuit 82 stores in the first memory area 87. The first parity data may be stored in the second memory area 88. The first parity data may have a size smaller than the input data. For example, when the input data has $2^N$ bits, the first parity data may have N+1 bits. The number of bits of the input data may be determined by a burst size of the memory device 80.

When the read circuit 83 reads data, stored in the first memory area 87, and generates output data during a test process, the parity data management unit 84 may be configured to generate second parity data using the output data. In some example embodiments of the inventive concepts, the output data may have the same number of bits as the input data, while the second parity data may have the same number of bits as the first parity data. Thus, in some example embodiments, the second parity data may have a size smaller than the output data. For example, when the output data has $2^N$ bits, the second parity data may have N+1 bits. In some example embodiments of the inventive concepts, the parity data management unit 84 may apply Error Correction Code (ECC) encoding to each of input data and output data, thereby generating each of the first parity data and the second parity data. To this end, and as described further below with reference to FIGS. 6-7, the parity data management unit 84 may include a first ECC engine 112 and a second ECC engine 114.

The parity data management unit 84 may be configured to generate third parity data using the first parity data and the second parity data. The third parity data may have the same number of bits as the first parity data and the second parity data. In some example embodiments, each of the input data and the output data includes $2^N$ bits, where N is a natural number, and each of the first parity data, the second parity data, and the third parity data includes N+1 bits. In some example embodiments of the inventive concepts, the third parity data may be generated by XORing the first parity data and the second parity data for each bit, while the parity data management unit 84 determines whether error is included in output data using the third parity data, and corrects an error if the error is included in output data.

When (e.g., in response to) a request is received from the test device 90 (e.g., in response to receipt of the request from the test device 90 at the memory device 80), the output circuit 85 may (e.g., is configured to) output (e.g., transmit) at least one instance of data of the first parity data, the second parity data, and the third parity data, generated by the parity data management unit 84, as verification data. As described previously, the test device 90 compares the verification data with reference data, and thus may determine whether an error has occurred during a process in which the memory controller 81 stores data in the memory area 86 or reads data. In some example embodiments, the output circuit 85 may output at least one instance of data of the first parity data, the second parity data, and the third parity data, as verification data over a plurality of times, and may output the output data as verification data.

Figure 6:
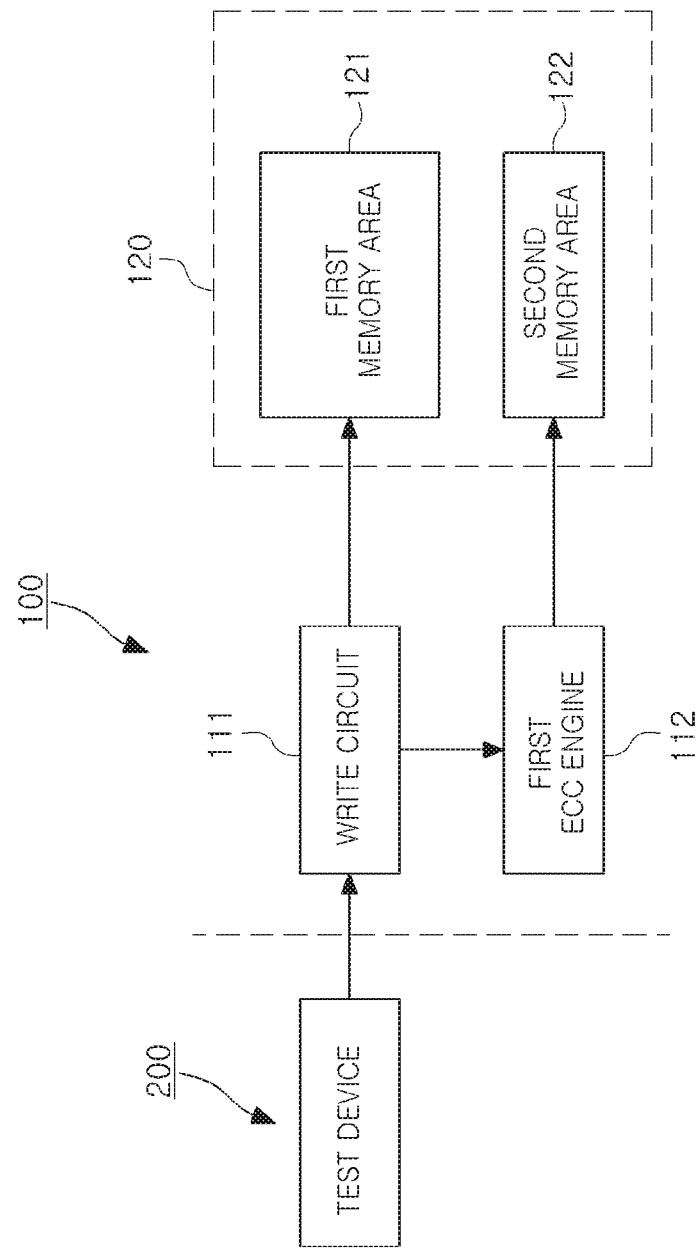
FIGS. 6 and 7 are block diagrams illustrating an operation of a memory device according to some example embodiments of the inventive concepts.
Figure 7:
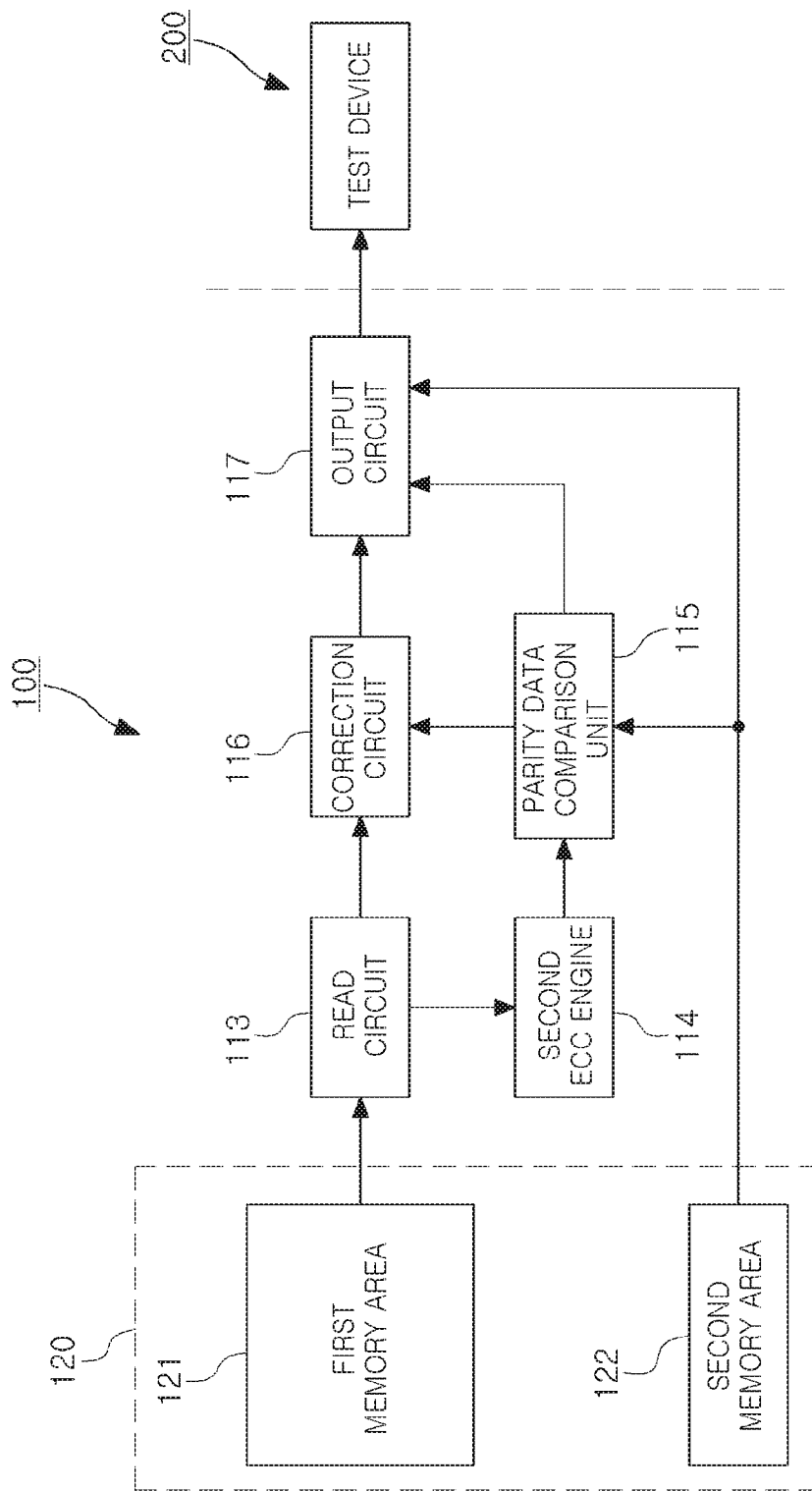

FIGS. 6 and 7 are block diagrams illustrating an operation of a memory device according to some example embodiments of the inventive concepts.

FIG. 6 is a block diagram for illustrating an operation for storing input data, transmitted by a test device 200, by a memory device 100, while FIG. 7 is a block diagram for illustrating an operation for outputting verification data by the memory device 100 in response to a request of the test device 200. Restated, FIGS. 6 and 7 include block diagrams of separate portions of the same memory device 100. In some example embodiments of the inventive concepts illustrated in FIGS. 6 and 7, a write circuit 111, a first ECC engine 112, a read circuit 113, a second ECC engine 114, a parity data comparison unit 115, a correction circuit 116, and an output circuit 117 may be included in a memory controller. For example, the first ECC engine 112 and the second ECC engine 114 may be included in a parity management unit of the memory device 100.

First, referring to FIG. 6, the input data, transmitted by the test device 200, may be stored in a first memory area 121 of a memory area 120 by the write circuit 111. Meanwhile, the first ECC engine 112 may generate first parity data, using (e.g., "based on") the input data which the write circuit 111 stores in the first memory area 121. The first parity data may have a size smaller than the input data. For example, when the input data has $2^N$ bits, the first parity data may have N+1 bits, N is a natural number. The first parity data may be stored in a second memory area 122.

Next, referring to FIG. 7, the read circuit 113 may read data, stored in the first memory area 121, and generate output data, in response to a request from the test device 200. The second ECC engine 114 may generate second parity data using (e.g., "based on") the output data generated by the write circuit 113. In some example embodiments of the inventive concepts, the output data may have the same size as the input data, while the first parity data may have the same size as the second parity data. The number of bits of the input data and the number of bits of the output data may be determined by a burst length of the memory device 100. When the burst length of the memory device 100 is 8 and the memory device is operated in byte units, each of input data and output data may include 64-bit data. When the burst length thereof is 16, each of input data and output data may include 128-bit data.

The parity data comparison unit 115 may compare second parity data generated by the second ECC engine 114, with first parity data stored in the second memory area 122. The first parity data may be parity data generated when the write circuit 111 stores input data in the first memory area 121, while the second parity data may be parity data generated from output data, when the read circuit 113 reads from the first memory area 121. The parity data comparison unit 115 compares the first parity data with the second parity data, thereby determining whether an error is included in output data.

In some example embodiments of the inventive concepts, the parity data comparison unit 115 generates third parity data by XORing (e.g., exclusively selecting between one of) the first parity data and the second parity data for each bit. In this case, if the third parity data has a bit with a value of '1', it may be determined that an error is included in output data. The correction circuit 116 may be configured to correct an error included in output data (e.g., an error of the output data), using (e.g., "based on") the third parity data generated by the parity data comparison unit 115.

The output circuit 117 may finally output (e.g., "transmit") output data in which an error is corrected by the correction circuit 116. Moreover, in the memory device 100 according to some example embodiments of the inventive concepts, the output circuit 117 may output at least one of the first parity data to the third parity data as verification data, in response to a request of the test device 200. For example, the output circuit 117 may be configured to output (e.g., "transmit") the first parity data and the third parity data as the verification data, in response to receipt of a request from the test device 200. The test device 200 may compare the verification data with particular (or, alternatively, predetermined) reference data, thereby determining whether an error has occurred in a write operation and a read operation of the memory device 100.

In some example embodiments of the inventive concepts, the test device 200 may generate reference data in consideration of input data, and receive the first parity data and the second parity data as verification data from the memory device 100. The test device 200 may determine whether an error has occurred during a process in which the memory device 100 stores input data, by comparing the reference data with the first parity data. Moreover, the test device 200 may determine whether an error has occurred during a process in which the memory device 100 generates output data, by comparing the reference data with the second parity data.

According to some example embodiments of the inventive concepts, compared to a method according to the related art, in which input data and output data are compared for each bit, only using reference data and verification data, having the smaller number of bits, an operation of the memory device 100 may be tested. Thus, during a limited time, a larger number of test processes with respect to more memory devices 100 may be performed, so efficiency of a test process may be improved. Thus, efficiency of manufacturing of improved quality memory devices may be improved.

Figure 8:
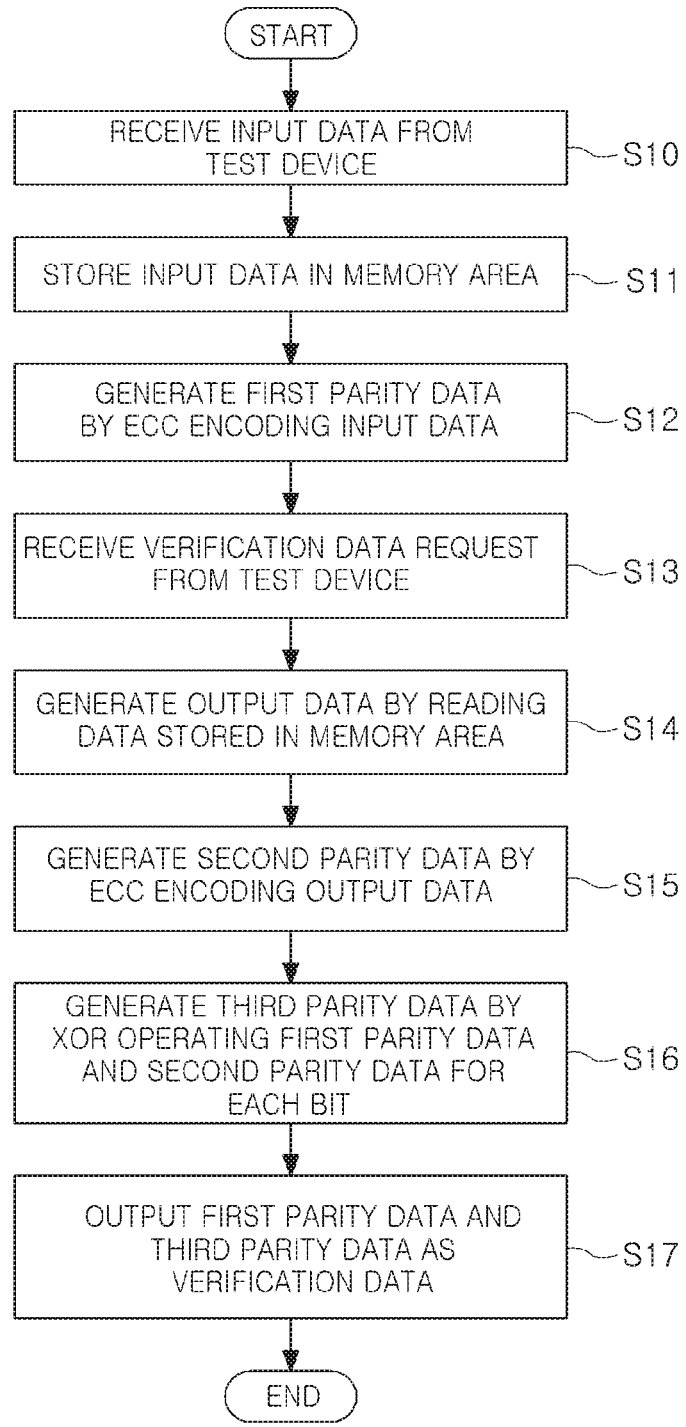
FIG. 8 is a flow diagram illustrating an operation of a memory device according to some example embodiments of the inventive concepts.

FIG. 8 is a flow diagram illustrating an operation of a memory device according to some example embodiments of the inventive concepts.

Referring to FIG. 8, an operation of a memory device according to some example embodiments of the inventive concepts may begin with a memory device receiving input data from a test device (S10). The input data may be data generated by the test device to verify a memory device, and the test device may additionally receive reference data. Meanwhile, the memory device may store the input data in a memory area (S11), and may generate first parity data by ECC encoding the input data (S12). The first parity data may have a size smaller than the input data, and may have a size equal to reference data which the test device receives.

The memory device may receive a request of verification data from the test device (S13), and may generate output data by reading data stored in the memory area (S14). Meanwhile, the memory device may generate second parity data by ECC encoding the output data (S15), and the second parity data may have a size equal to the first parity data and the reference data.

The memory device may generate third parity data by using XOR calculation (e.g., XOR operating, "XORing," etc.) the first parity data and the second parity data for each bit (S16). The memory device may find an error included in output data with reference to the third parity data, and may correct the error, having been found. Meanwhile, the memory device may output the first parity data and the third parity data as verification data to the test device (S17).

The test device may determine whether an error has occurred during a write operation of the memory device by comparing the reference data with the first parity data. Moreover, the test device may determine whether an error has occurred during a read operation of the memory device using the third parity data. In some example embodiments of the inventive concepts, the test device may determine whether an error has occurred during a write operation of the memory device by comparing the reference data with the first parity data. When it is determined that an error does not occur in a write operation of the memory device, if a bit having a value, 1, is included in the third parity data, the test device may determine that an error has occurred in a reading operation of the memory device.

Figure 9:
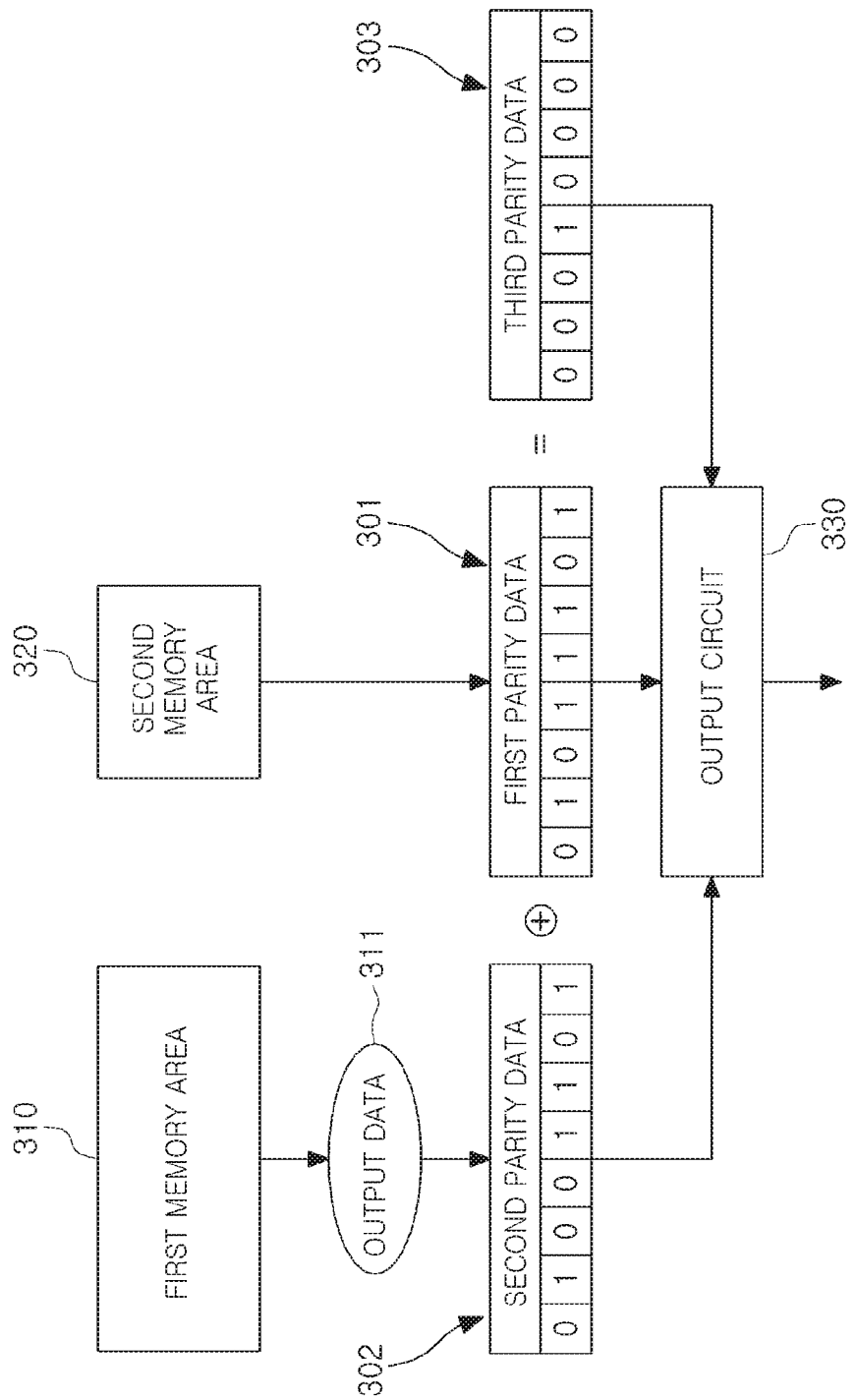
FIG. 9 is a view illustrating an operation of a memory device according to some example embodiments of the inventive concepts.

FIG. 9 is a view illustrating an operation of a memory device according to some example embodiments of the inventive concepts.

Referring to FIG. 9, a memory device may generate output data 311 by reading data stored in a first memory area 310, and may generate second parity data 302 using the output data. The second parity data 302 may be generated by ECC encoding the output data, and may be compared with the first parity data 301 stored in a second memory area 320. The first parity data 301 may be parity data generated during a process in which data is stored in the first memory area 310. In some example embodiments of the inventive concepts illustrated in FIG. 9, a size of data, which a memory device stores or outputs according to one write command and one read command, may be 128 bits, so each of the first parity data 301 and the second parity data 302 may be 8-bits data.

The memory device may generate third parity data 303 by XORing the first parity data 301 and the second parity data 302 for each bit. In some example embodiments of the inventive concepts illustrated in FIG. 9, a fifth bit of the third parity data 303 may have a value of '1', which may correspond to a case in which an error has occurred in one of a write operation and a read operation of the memory device.

An output circuit 330 may transmit at least one of first parity data, second parity data, and third parity data as verification data to the test device. For example, the test device may receive first parity data and second parity data, or may receive first parity data and third parity data, as verification data. The test device may compare verification data, received from the memory device, with reference data, generated internally, while preparing input data for a test operation. For example, the input data may be data stored in the first memory area 310 by the memory device, and the test device may receive reference data separately from the input data.

When the first parity data and the second parity data are received as verification data, the test device may compare each of the first parity data and the second parity data with reference data. When the first parity data does not match with the reference data, the test device may determine that an error has occurred in a write operation of the memory device. When the second parity data does not match with the reference data, the test device may determine that an error has occurred in a read operation of the memory device.

When the first parity data and the third parity data are received as verification data, the test device may determine whether an error has occurred in a writing operation of the memory device by comparing the first parity data with the reference data in advance. With reference to whether an error has occurred in a write operation, together with the third parity data, a test device may determine whether an error has occurred in a read operation. For example, even when an error does not occur in a write operation, but the third parity data includes a bit having a value of 1, it may be determined that an error has occurred in a read operation.

Figure 10:
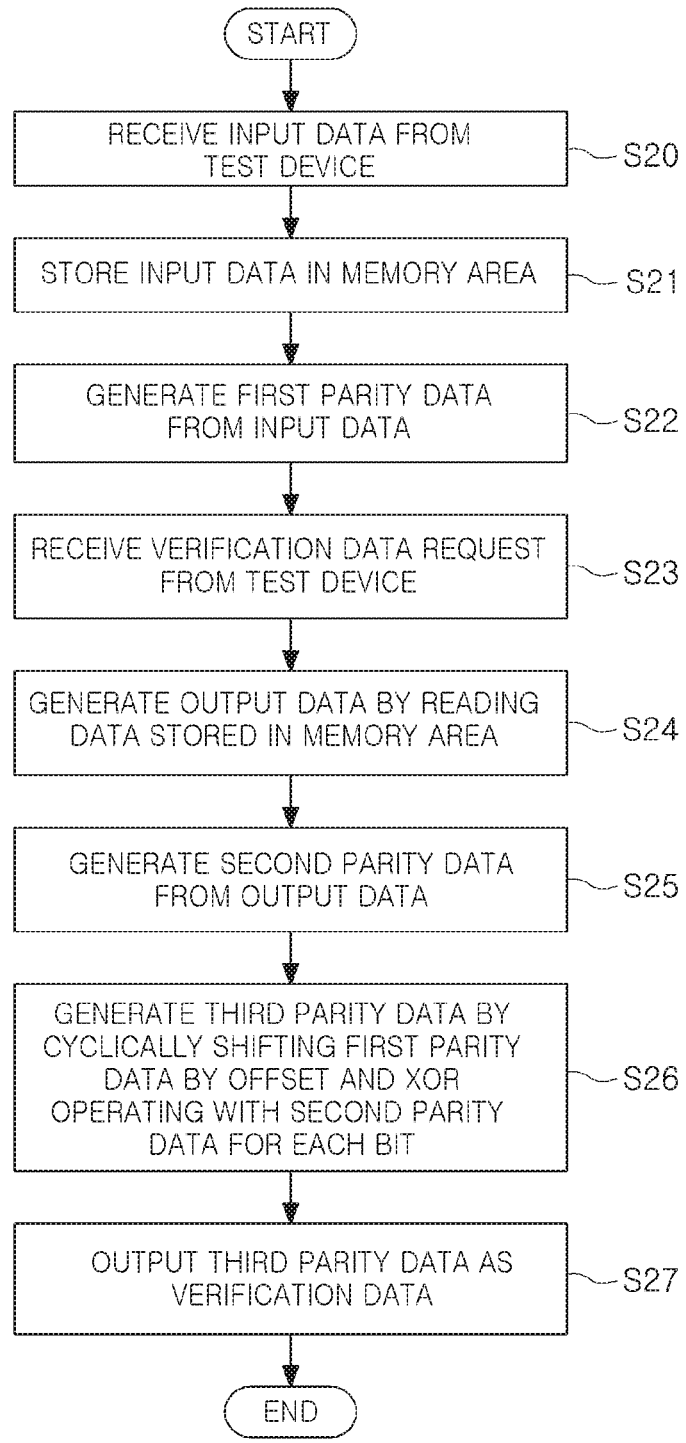
FIG. 10 is a flow diagram illustrating an operation of a memory device according to some example embodiments of the inventive concepts.

FIG. 10 is a flow diagram illustrating an operation of a memory device according to some example embodiments of the inventive concepts.

Referring to FIG. 10, an operation of a memory device according to some example embodiments of the inventive concepts may begin with a memory device receiving input data from a test device (S20). The input data may be data generated by the test device to verify a memory device, and the test device may programmatically receive reference data having a size smaller than the input data. The memory device may store the input data in a memory area (S21), and may generate first parity data by ECC encoding the input data (S22).

The memory device may receive a request of verification data from the test device (S23), and may generate output data by reading data stored in the memory area (S24). Meanwhile, the memory device may generate second parity data by ECC encoding the output data (S25), and the second parity data may have a size equal to the first parity data and the reference data.

The memory device (e.g., the parity data management unit) may generate third parity data by (e.g., "based on") XORing first parity data (e.g., bits included in the first parity data) with the second parity data for each bit after (e.g., "subsequently to") the first parity data is cyclically shifted (e.g., the bits included in the first parity data are cyclically shifted) by a particular (or, alternatively, predetermined) offset (S26). The memory device may output the third parity data as verification data (S27), and the test device may determine that an error has occurred in a write operation and a read operation of the memory device by comparing the third parity data with the reference data.

Figure 11:
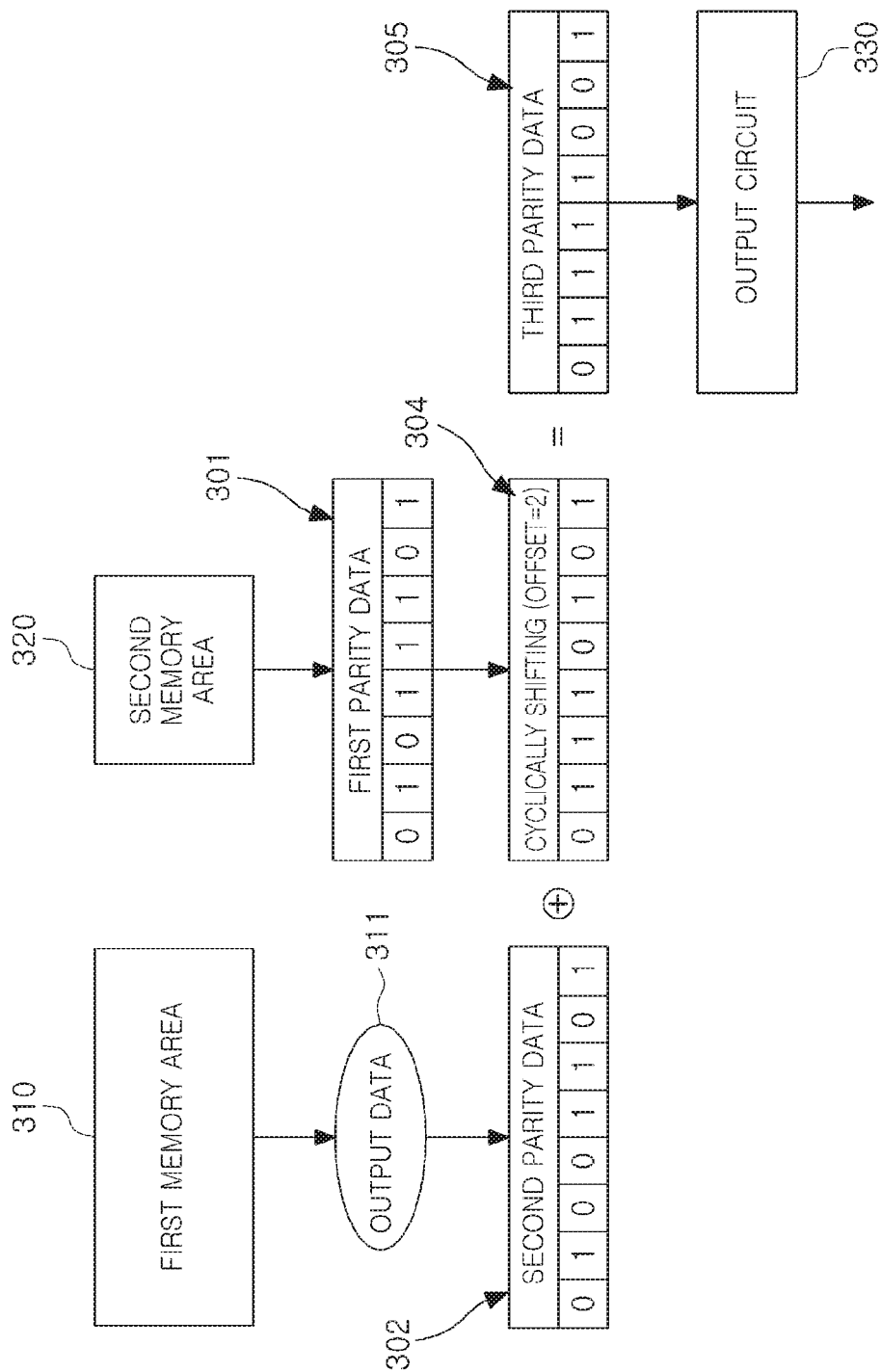
FIG. 11 is a view illustrating an operation of a memory device according to some example embodiments of the inventive concepts.

FIG. 11 is a view illustrating an operation of a memory device according to some example embodiments of the inventive concepts.

Referring to FIG. 11, a memory device may generate output data 311 by reading data stored in a first memory area 310, and may generate second parity data 302 using the output data. The second parity data 302 may be generated by ECC encoding the output data.

Meanwhile, the memory device may read the first parity data 301, stored in the second memory area 320, and cyclically shift the first parity data by a particular (or, alternatively, predetermined) offset, thereby generating temporary parity data 304. In some example embodiments of the inventive concepts illustrated in FIG. 11, offset may be 2, so a value of eight bits of the first parity data may be cyclically shifted by 2.

The memory device may generate third parity data 305 by XORing the second parity data 302 and the temporary parity data 304 for each bit. The temporary parity data 304 is data generated by cyclically shifting the first parity data 301, generated by ECC encoding input data, by offset. In this case, even when an error does not occur in a writing operation and a reading operation, the third parity data 305 may include a bit having a value of 1.

The output circuit 330 may transmit the third parity data as verification data to the test device, and the test device may verify an operation of the memory device by comparing the third parity data with the reference data. To verify an operation of a memory device only using third parity data, the reference data may be generated using a method different from the method described previously.

The test device may generate input data and transmit the input data to the memory device to verify an operation of the memory device, and may receive pre-calculated reference data, in addition to the input data. The test device may compare the reference data and the third parity data 305 for each bit. In this case, when the reference data and the third parity data 305 are different from each other, it may be determined that an error has occurred in at least one of a write operation and a read operation of the memory device. An operation of the memory device for storing and outputting input data and output data, having $2^N$ bits, may be verified using only the third parity data 305 having N+1 bits. Thus, efficiency of a test process may be improved.

Figure 12:
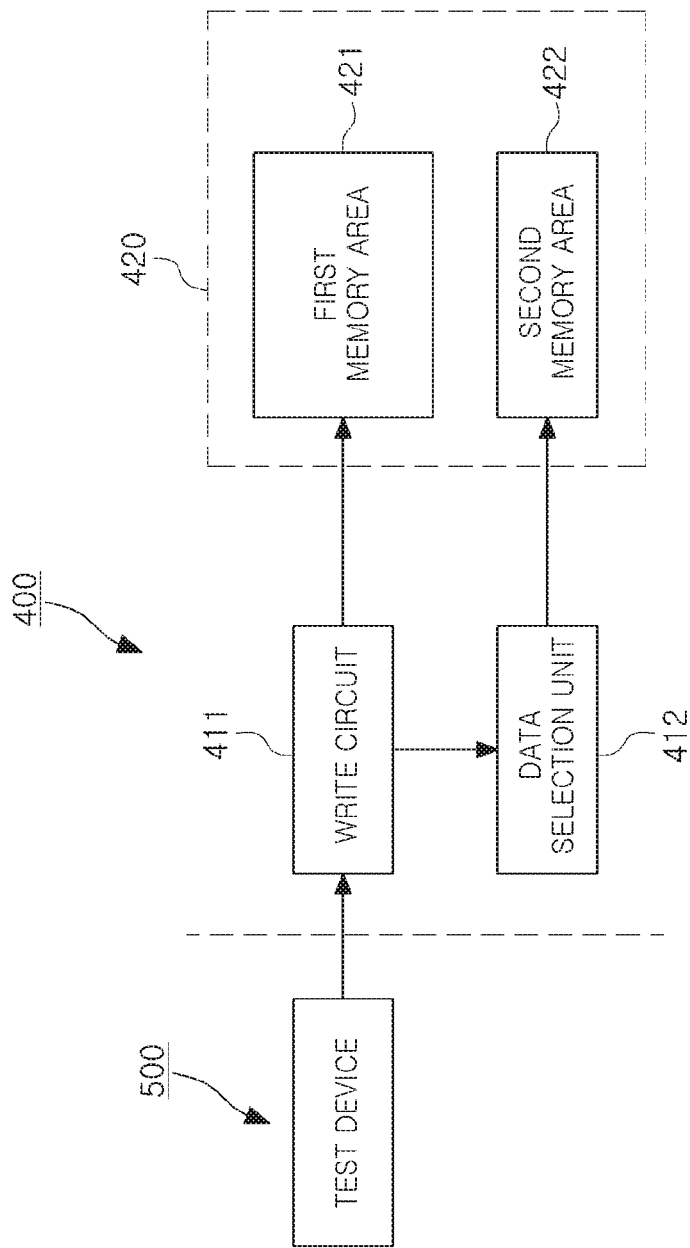
FIGS. 12 and 13 are block diagrams illustrating an operation of a memory device according to some example embodiments of the inventive concepts.
Figure 13:
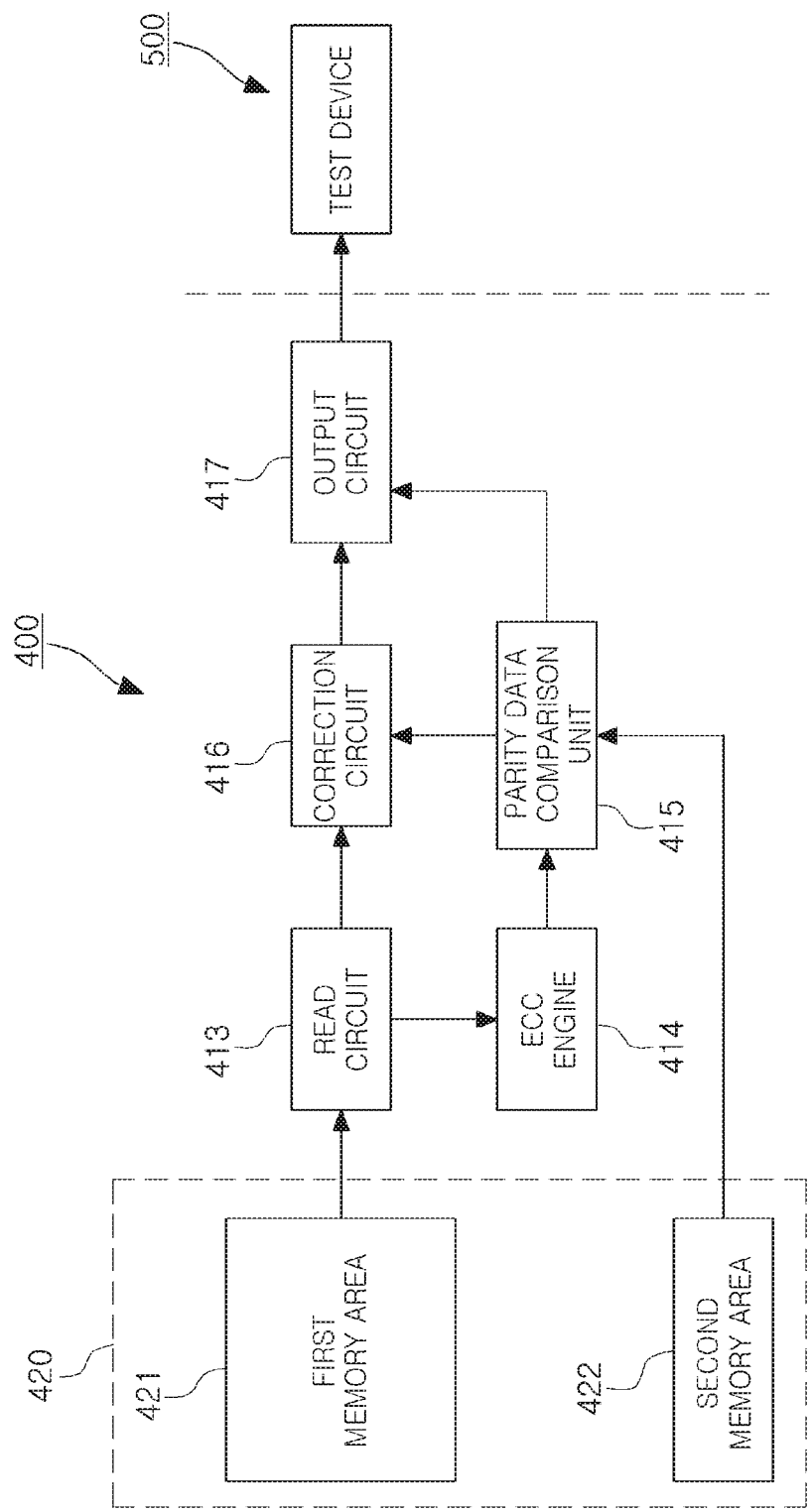

FIGS. 12 and 13 are block diagrams illustrating an operation of a memory device according to some example embodiments of the inventive concepts.

First, referring to FIG. 12, input data, transmitted by a test device 500, may be stored in a first memory area 421 of a memory area 420 by a write circuit 411. A data selection unit 412 may select at least a portion of input data, which a write circuit 411 stores in a first memory area 421, and stores the at least a portion of input data as first parity data in a second memory area 422. A size of the first parity data may be smaller than a size of the input data. For example, when the input data has $2^N$ bits, the data selection unit 412 may select N+1 bits from the input data and generates first parity data, wherein N is a natural number.

Next, referring to FIG. 13, the read circuit 413 may read data, stored in the first memory area 421, and generate output data, in response to a request from the test device 500. The ECC engine 414 may generate second parity data using the output data generated by the write circuit 413. In some example embodiments of the inventive concepts, the output data may be provided as the same size as the input data, while the second parity data may be provided as the same size as the first parity data stored in the second memory area 422.

The parity data comparison unit 415 may compare second parity data generated by the ECC engine 414, with the first parity data stored in the second memory area 422. The parity data comparison unit 415 may generate third parity data by comparing the first parity data with the second parity data. In some example embodiments of the inventive concepts, the parity data comparison unit may generate third parity data by XORing the first parity data and the second parity data for each bit.

The output circuit 417 may finally output (e.g., "transmit") output data in which an error is corrected by the correction circuit 416. Moreover, in some example embodiments of the inventive concepts, the output circuit 417 may output third parity data as verification data, in response to a request of the test device 500. The test device 500 may compare the third parity data, received as verification data, with particular (or, alternatively, predetermined) reference data, thereby determining whether an error has occurred in a writing operation and a reading operation of the memory device 400.

In some example embodiments of the inventive concepts, the test device 500 may directly write reference data. The test device 500 may compare the reference data with the third parity data, thereby determining whether an error has occurred in a writing operation and a reading operation of the memory device 400.

When an error has occurred in a write operation of the memory device 400, the first parity data generated by the data selection unit 412, may be different from data generated by selecting a portion of input data in the test device 500. Restated, a parity data management unit that includes the data selection unit 412 may be configured to generate the first parity data based on selecting a portion (e.g., a limited portion) of the input data. Thus, the reference data and the third parity data may not match with each other. Moreover, when (e.g., "in response to") an error has occurred in a read operation of the memory device 400, second parity data generated by the ECC engine 414 (e.g., second parity data generated by a parity data management unit that includes the ECC engine 414 based on performing ECC encoding on the output data), may be different from the reference data of the test device 500, so the reference data and the third parity data may not match with each other. Thus, only using third parity data having a small number of bits, the memory device 400 may be verified.

Figure 14:
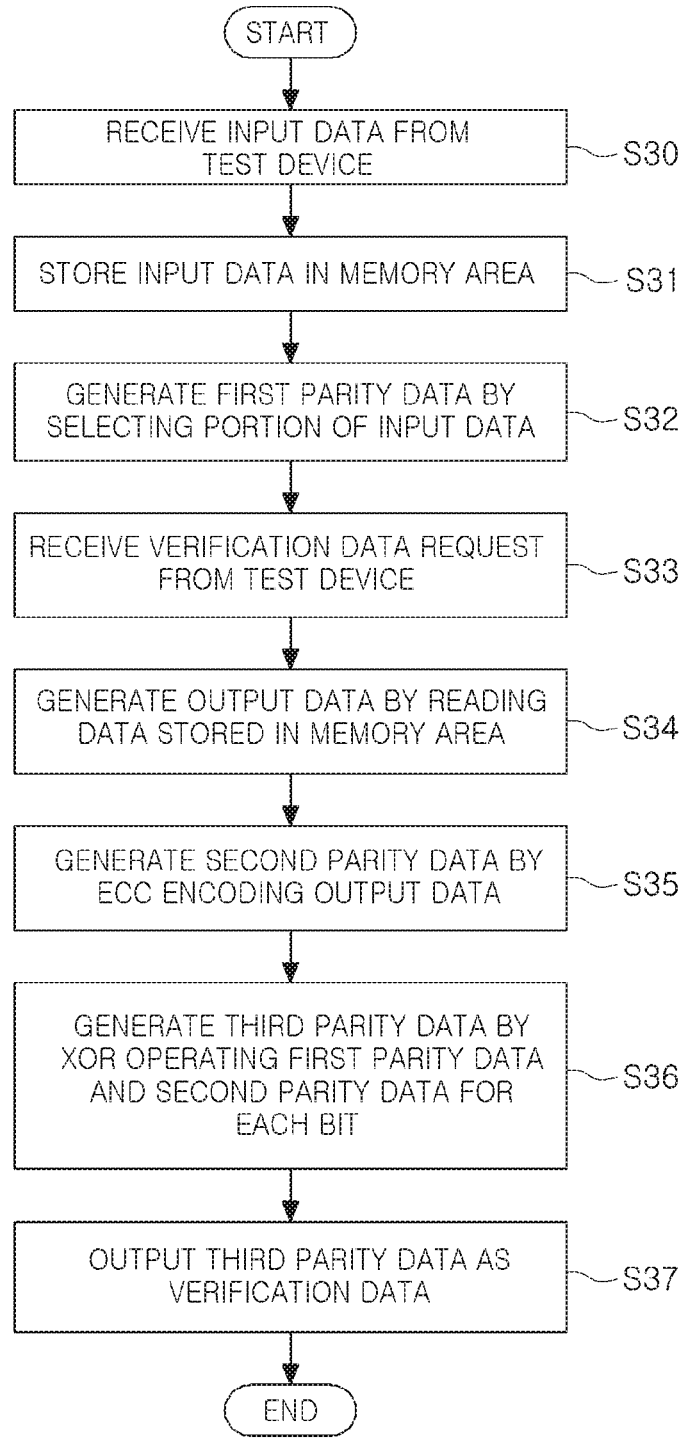
FIG. 14 is a flow diagram illustrating an operation of a memory device according to some example embodiments of the inventive concepts.

FIG. 14 is a flow diagram illustrating an operation of a memory device according to some example embodiments of the inventive concepts.

Referring to FIG. 14, an operation of a memory device according to some example embodiments of the inventive concepts may begin with a memory device receiving input data from a test device (S30). The input data may be data generated by the test device to verify a memory device, and the test device may generate reference data in an amount smaller than the input data, using the input data. The memory device may store the input data in a memory area (S31), and may generate first parity data by selecting a portion of the input data (S32).

The memory device may receive a verification data request from the test device (S33), and may generate output data by reading data stored in the memory area (S34). Meanwhile, the memory device may generate second parity data by ECC encoding the output data (S35). The second parity data may be provided in an amount equal to the first parity data and the reference data generated by the test device.

The memory device (e.g., the parity data management unit) may generate third parity data by (based on") using XOR calculation the first parity data and the second parity data (e.g., based on XORing the first parity data and the second parity data) for each bit (S36). The memory device may output the third parity data as verification data (S37), and the test device may verify a writing operation and a reading operation of the memory device by comparing the third parity data with the reference data.

Figure 15:
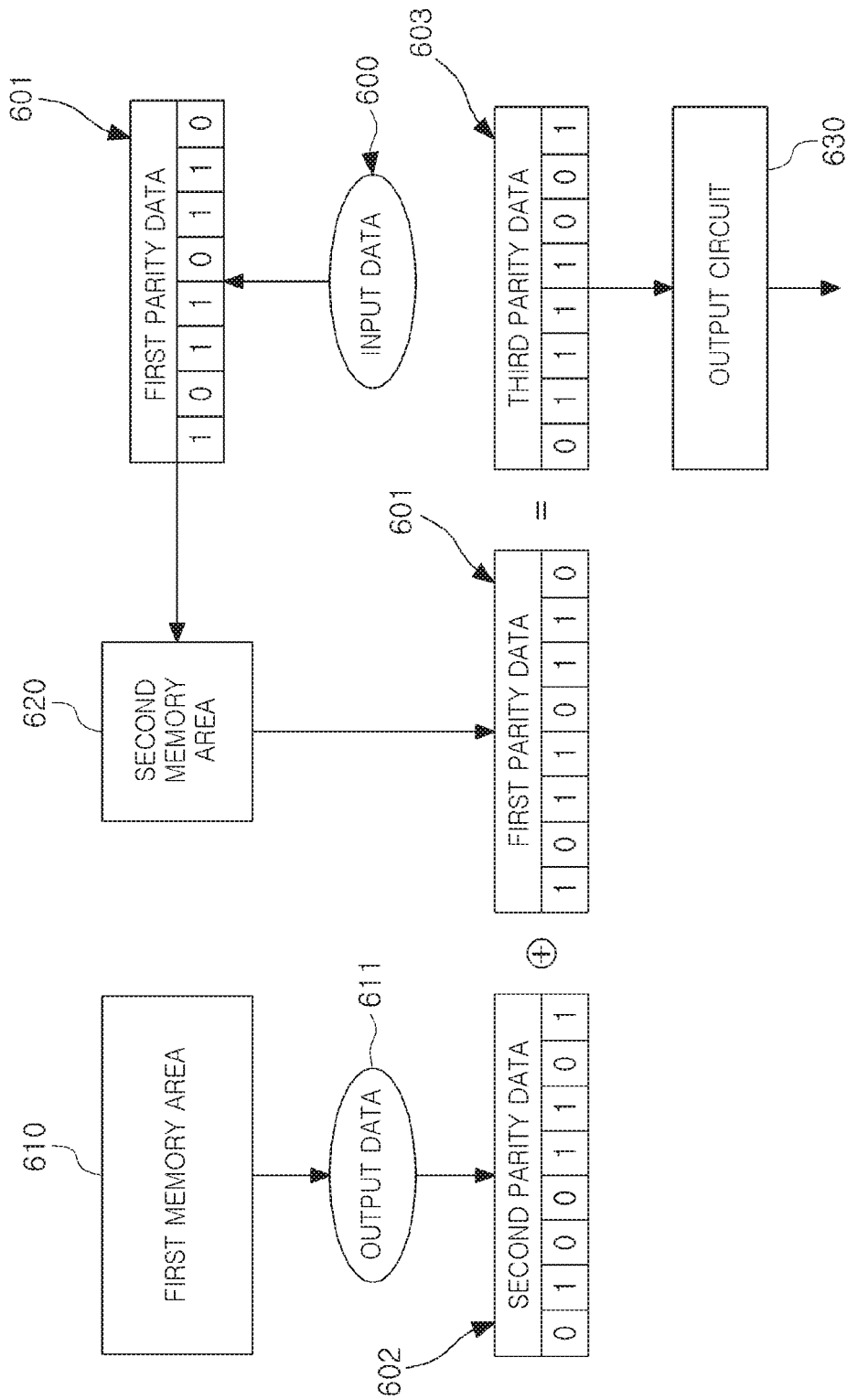
FIG. 15 is a view illustrating an operation of a memory device according to some example embodiments of the inventive concepts.

FIG. 15 is a view illustrating an operation of a memory device according to some example embodiments of the inventive concepts.

Referring to FIG. 15, a memory device may generate output data 611 by reading data stored in a first memory area 610, and may generate second parity data 602 using output data. The second parity data 602 may be generated by ECC encoding the output data.

Meanwhile, the memory device may generate third parity data 603 by using XOR calculation the first parity data 601, stored in the second memory area 620, with the second parity data 602 for each bit. The first parity data 601 is data generated by selecting some bits of input data 600, and may not be equal to the second parity data 602. Thus, even when an error does not occur in a writing operation and a reading operation, a bit having a value of 1 may appear in the third parity data 603.

The output circuit 630 may transmit the third parity data as verification data to the test device, and the test device may verify an operation of the memory device by comparing the third parity data with the reference data. To verify an operation of the memory device only using the third parity data, the test device may receive reference data for comparison with the third parity data.

The test device may determine whether an error has occurred in a writing operation and a reading operation of the memory device, by comparing the reference data with the third parity data 603 for each bit. In some example embodiments of the inventive concepts, an operation of the memory device for storing and outputting input data and output data, having $2^N$ bits, may be verified only using the third parity data 603 having N+1 bits, wherein N is a natural number. Thus, efficiency of a test process may be improved, thereby improving efficiency of manufacturing of improved-quality memory devices and further improving overall quality of manufactured memory devices FIG. 16 is a view illustrating a test method of a memory device according to some example embodiments of the inventive concepts.

Figure 16:
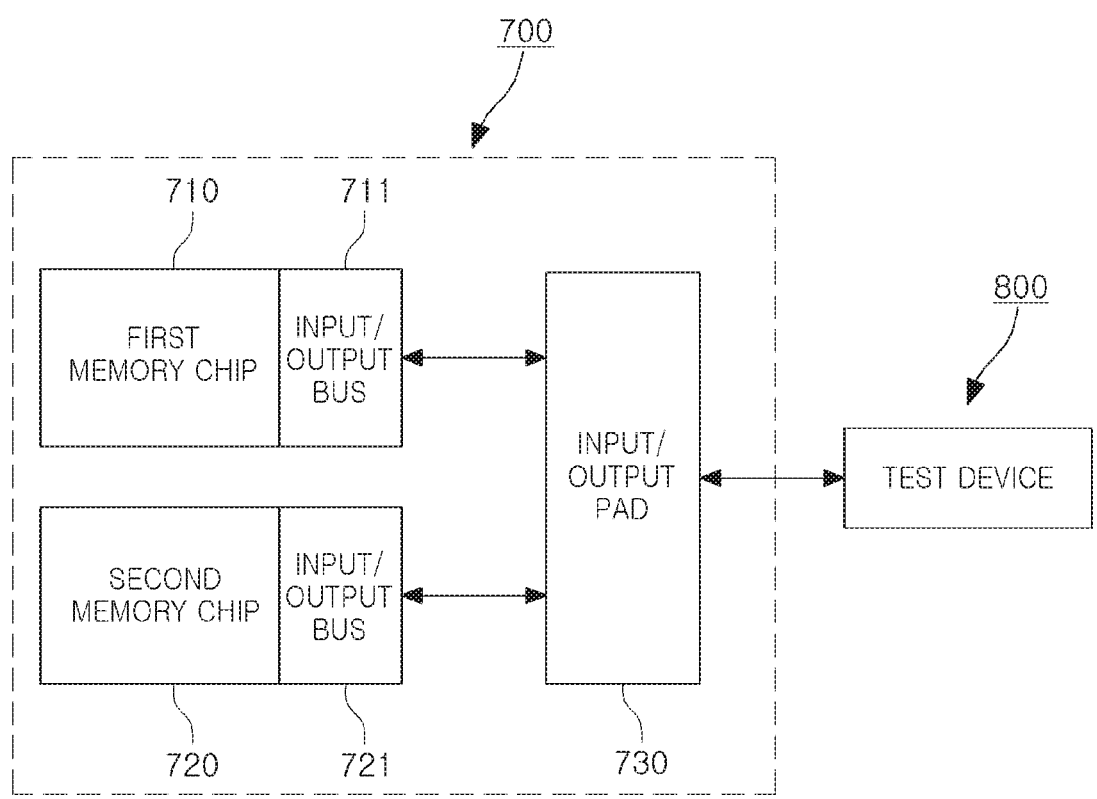
FIG. 16 is a view illustrating a test method of a memory device according to some example embodiments of the inventive concepts.

Referring to FIG. 16, a memory device 700, a test target, may include a first memory chip 710 and a second memory chip 720 as well as an input/output bus 730. As shown in FIG. 16, the first memory chip 710 and the second memory chip 720 may share the input/output bus 730. The first memory chip 710 and the second memory chip 720 may include input/output pads 711 and 721, for receiving or outputting data through the input/output bus 730, respectively. The first memory chip 710 and the second memory chip 720 may be connected to the test device 800 while sharing the input/output bus 730. The input/output bus 730 may provide a data transmission path between each of the input/output pads 711 and 721 and the test device 800, and may include input/output pins. Each memory chip of the first memory chip 710 and the second memory chip 720 may include the write circuit, the read circuit, the parity data management unit, bank array, memory area, and/or the output circuit as described herein in any of the example embodiments described herein.

To perform a test process, the test device 800 may generate input data and transmit the input data to the memory device 700. Each of the first memory chip 710 and the second memory chip 720 may receive the input data through the input/output bus 730 and store the input data. Thereafter, when a request from the test device 800 is transferred, the first memory chip 710 and the second memory chip 720 may transmit verification data required for a test process through the input/output bus 730 to the test device 800.

When each of the first memory chip 710 and the second memory chip 720 generates output data in an amount equal to input data and transmits the output data as verification data to the test device 800, the time required for the test process may become long. For example, when input data and output data have a burst size defined by a burst length, during the reference time corresponding to a burst length, the test device 800 may only receive verification data, output by one of the first memory chip 710 and the second memory chip 720.

In some example embodiments of the inventive concepts, each of the first memory chip 710 and the second memory chip 720 generates verification data, in an amount smaller than input data and output data, and transmits the verification data to the test device 800, while the test device 800 compares the verification data with particular (or, alternatively, predetermined) reference data, thereby performing a test process. Thus, during the reference time corresponding to a burst length, verification data of each of the first memory chip 710 and the second memory chip 720 may be received. Hereinafter, the following description will be made with reference to FIGS. 17A, 17B, and 18.

Figure 17A:
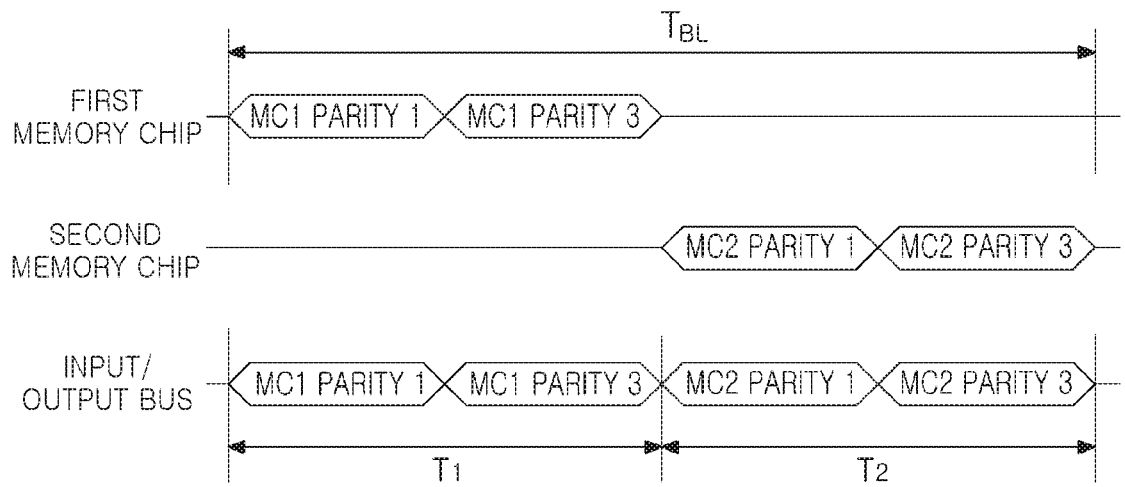
FIGS. 17A, 17B, and 18 are timing diagrams illustrating a test method of a memory device according to some example embodiments of the inventive concepts.
Figure 17B:
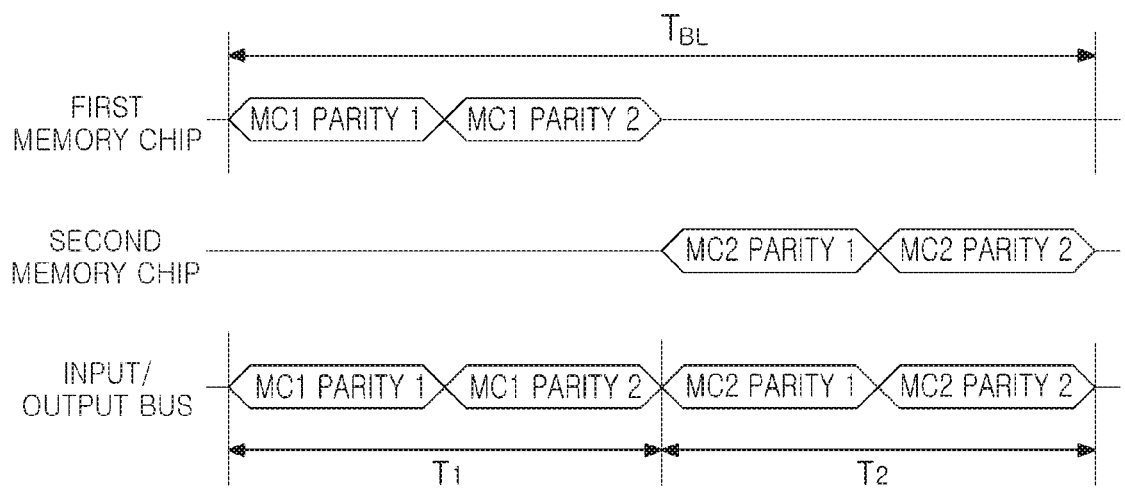
Figure 18:
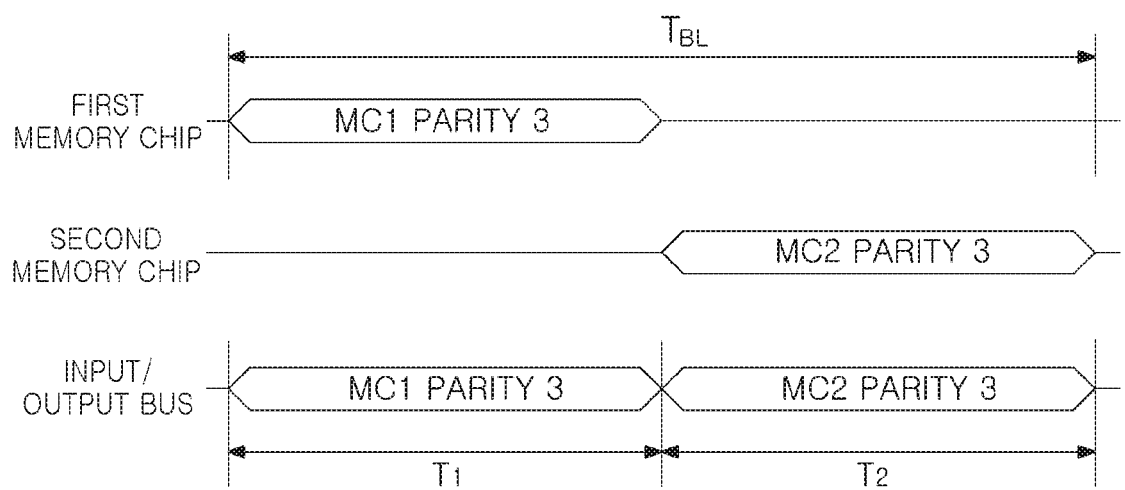

FIGS. 17A, 17B, and 18 are timing diagrams illustrating a test method of a memory device according to some example embodiments of the inventive concepts.

In some example embodiments of the inventive concepts illustrated in FIGS. 17A and 17B, the first memory chip 710 and the second memory chip 720 may output first parity data and third parity data or first parity data and second parity data, as verification data. Meanwhile, in some example embodiments of the inventive concepts illustrated in FIG. 18, each of the first memory chip 710 and the second memory chip 720 may output third parity data as verification data.

First, referring to FIG. 17A, during the reference time TBL defined by a burst length, the first memory chip 710 and the second memory chip 720 may sequentially output verification data. First parity data MC1 PARITY1 for verifying a writing operation of the first memory chip 710, and third parity data MC1 PARITY3 for verifying a reading operation of the first memory chip 710 may be sequentially output during the first time T1. The first time T1 may be understood to be a time of outputting data corresponding to a bust size. When the first time T1 has elapsed, the first parity data MC2 PARITY1 for verifying a writing operation of the second memory chip 720, and third parity data MC2 PARITY3 for verifying a reading operation of the second memory chip 720 may be sequentially output during the second time T2.

Referring to FIG. 17B, the first parity data MC1 PARITY1 for verifying a writing operation of the first memory chip 710, and second parity data MC1 PARITY2 for verifying a reading operation of the first memory chip 710 may be sequentially output during the first time T1. When the first time T1 has elapsed, the first parity data MC2 PARITY1 for verifying a writing operation of the second memory chip 720, and the second parity data MC2 PARITY2 for verifying a reading operation of the second memory chip 720 may be sequentially output during the second time T2. In example embodiments illustrated in FIGS. 17A and 17B, during the reference time TBL, the test device 800 may receive verification data, output by each of the first memory chip 710 and the second memory chip 720. Thus, efficiency of a test process may be improved.

Assuming that the memory device 700 is operated in a double data rate (DDR) mode and a burst length is 16, during the reference time TBL, a clock signal may have a total of eight cycles. When each of the first memory chip 710 and the second memory chip 720 has eight DQ and a burst size is 128 bits, each of parity data, generated by the first memory chip 710 and the second memory chip 720, may be 8 bits. In a manner different from a test process according to the related art, in which each of eight DQ should output 16-bit data during the reference time TBL, in some example embodiments of the inventive concepts, eight DQs, included in the first memory chip 710, may only output 2-bit data during the first time T1, and eight DQs, included in the second memory chip 720, may only output 2-bit data during the second time T2. In other words, the time for DQs, included in each of the first memory chip 710 and the second memory chip 720, to output a single datum, increases, so accuracy of the test process may be improved.

Next, referring to FIG. 18, the test device 800 may receive the third parity data MC1 PARITY3 and MC2 PARITY3 as verification data from the first memory chip 710 and the second memory chip 720, respectively. In other words, in some example embodiments of the inventive concepts illustrated in FIG. 18, during the reference time TBL, through the input/output bus 730, the third parity data MC1 PARITY3 of the first memory chip 710 and the third parity data MC2 PARITY3 of the second memory chip 720 may only be output. Thus, verification data, output by a plurality of memory chips 710 and 720 during the reference time TBL, may be received by the test device 800. Moreover, the time for each DQ of the plurality of memory chips 710 and 720 to output a single datum increases. Thus, efficiency and accuracy of a test process may be improved, thereby improving efficiency of manufacturing of improved-quality memory devices and further improving overall quality of manufactured memory devices.

Figure 19:
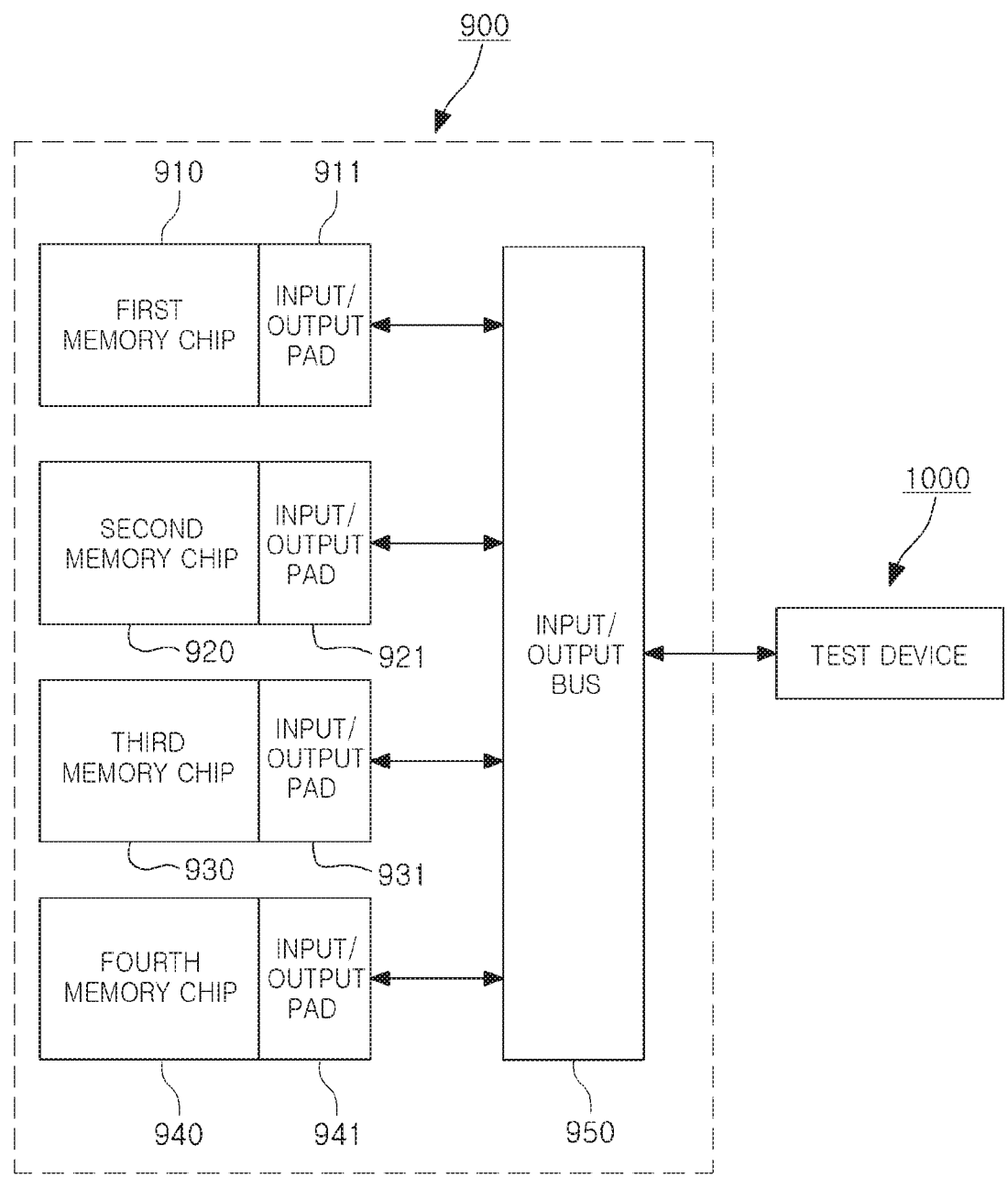
FIG. 19 is a view illustrating a test method of a memory device according to some example embodiments of the inventive concepts.

FIG. 19 is a view illustrating a test method of a memory device according to some example embodiments of the inventive concepts.

Referring to FIG. 19, a memory device 900, a test target, may include first to fourth memory chips 910 to 940 (e.g., first memory chip 910, second memory chip 920, third memory chip 930, and fourth memory chip 940) as well as an input/output bus 950. The first to fourth memory chips 910 to 940 may include input/output pads 911 to 941 (e.g., input/output pad 911, input/output pad 921, input/output pad 931, and input/output pad 941), for receiving or outputting data through the input/output bus 950, respectively. The first to fourth memory chips 910 to 940 may be connected to the test device 1000 while sharing the input/output bus 950. To perform a test process, the test device 1000 may generate input data and transmit the input data to the memory device 900. Each of the first to fourth memory chips 910 to 940 may receive the input data through the input/output bus 950 and store the input data. Thereafter, when a request from the test device 1000 is transferred, the first to fourth memory chips 910 to 940 may transmit verification data required for a test process through the input/output bus 950 to the test device 1000.

When each of the first to fourth memory chips 910 to 940 generates output data in an amount equal to input data and transmits the output data as verification data to the test device 1000, the time required for the test process may become long. For example, when the input data and the output data have a burst size, the test device 1000 may require the reference time corresponding to a burst length four times to verify the first to fourth memory chips 910 to 940. In some example embodiments of the inventive concepts, each of the first to fourth memory chips 910 to 940 generates verification data, in an amount smaller than input data and output data, and transmits the verification data to the test device 1000, while the test device 1000 compares the verification data with particular (or, alternatively, predetermined) reference data, thereby performing a test process. Thus, during the reference time corresponding to a burst length, verification data of each of the first to fourth memory chips 910 to 940 may be received. Hereinafter, the following description will be made with reference to FIGS. 20 and 21.

Figure 20:
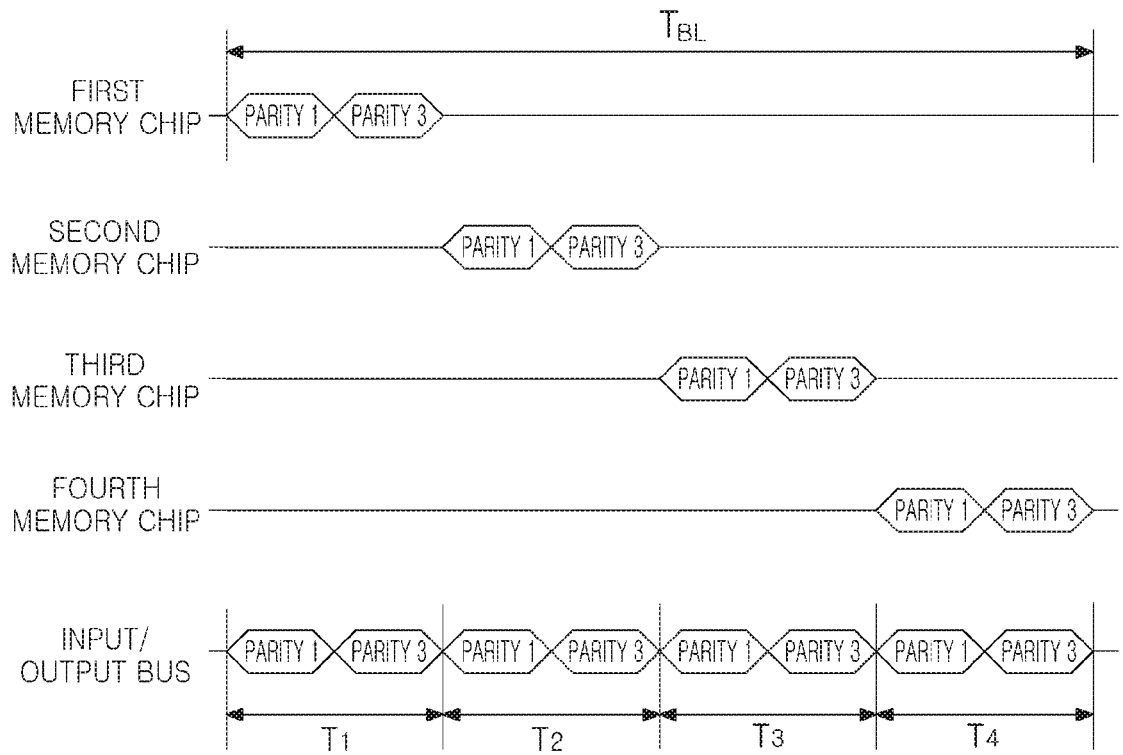
FIGS. 20 and 21 are timing diagrams illustrating a test method of a memory device according to some example embodiments of the inventive concepts.
Figure 21:
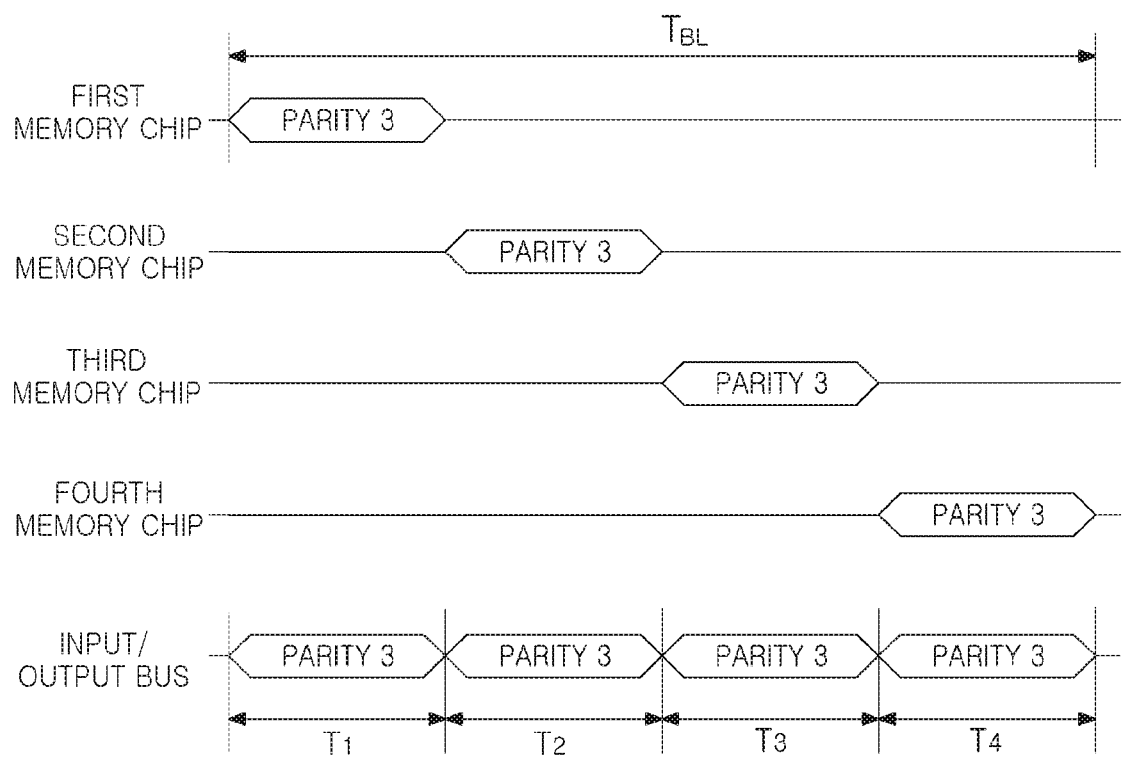

FIGS. 20 and 21 are timing diagrams illustrating a test method of a memory device according to some example embodiments of the inventive concepts.

In some example embodiments of the inventive concepts illustrated in FIG. 20, first to fourth memory chips 910 to 940 may output first parity data and third parity data as verification data. Meanwhile, in some example embodiments of the inventive concepts illustrated in FIG. 21, each of the first to fourth memory chips 910 to 940 may output third parity data as verification data.

First, referring to FIG. 20, during the reference time TBL defined by a burst length, the first to fourth memory chips 910 to 940 may sequentially output verification data. For example, each of the first to fourth memory chips 910 to 940 may output verification data in response to a request from a test device, such that the verification data is sequentially transmitted to the test device through the input/output bus 950 during a time of outputting data corresponding to a burst size. Each of the first to fourth memory chips 910 to 940 may sequentially output first parity data PARITY1 for verifying a writing operation, and third parity data PARITY3 for verifying a reading operation. An input/output bus 950 may be connected to input/output pads 911 to 941, included in the first to fourth memory chips 910 to 940, at first to fourth times T1 to T4, respectively.

Assuming that the memory device 900 is operated in a DDR mode and a burst length is 16, during the reference time TBL, a clock signal may have a total of eight cycles. When each of the first to fourth memory chips 910 to 940 has eight DQs and a burst size is 128 bits, parity data generated by each of the first to fourth memory chips 910 to 940 may be 8 bits. Thus, a total quantity of bits of the verification data output by the first to fourth memory chips 910 to 940 in response to a request from a test device being received at the first to fourth memory chips 910 to 940 may be smaller than a quantity of bits defined by a burst size of the first to fourth memory chips 910 to 940. Such a burst size of each of the first to fourth memory chips 910 to 940 may include $2^N$ bits. In a manner different from a test process according to the related art, in which each of eight DQs should output 16-bit data during the reference time TBL, in some example embodiments of the inventive concepts, eight DQs, included in each of the first to fourth memory chips 910 to 940, may only output 2-bit data during each of first to fourth times T1 to T4. Thus, the time for DQs, included in each of the first to fourth memory chips 910 to 940, to output a single datum, increases, so accuracy of the test process may be improved, thereby improving efficiency of manufacturing of improved-quality memory devices and further improving overall quality of manufactured memory chips.

Next, referring to FIG. 21, the test device 1000 may receive the third parity data PARITY3 as verification data from each of the first to fourth memory chips 910 to 940. In some example embodiments of the inventive concepts illustrated in FIG. 21, during the reference time TBL, through the input/output bus 950, the third parity data PARITY3, output by the first to fourth memory chips 910 to 940, may only be output. Thus, verification data, output by the first to fourth memory chips 910 to 940 during the reference time TBL, may be received by the test device 1000. Moreover, the time for each DQ of the first to fourth memory chips 910 to 940 to output a single datum increases. Thus, efficiency and accuracy of a test process may be improved, thereby improving efficiency of manufacturing of improved-quality memory chips and further improving overall quality of manufactured memory chips.

In some example embodiments one of the memory chips (e.g., the first memory chip 910) may be configured to output a high impedance signal while (e.g., concurrently with) another memory chip (e.g., the second memory chip 920) outputs verification data, and one of the memory chips (e.g., the first memory chip 910) may be configured to output verification data while (e.g., concurrently with) a remaining plurality of the memory chips (e.g., the second through fourth memory chips 920 to 940) output a high impedance signal.

Figure 22:
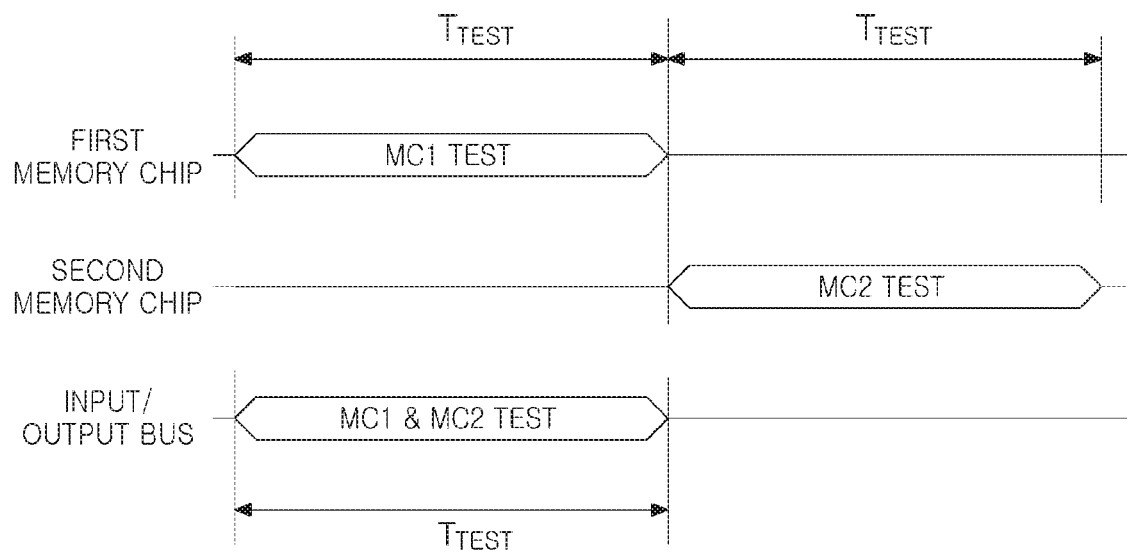
FIGS. 22 and 23 are views illustrating a test method of a memory device according to some example embodiments of the inventive concepts.
Figure 23:
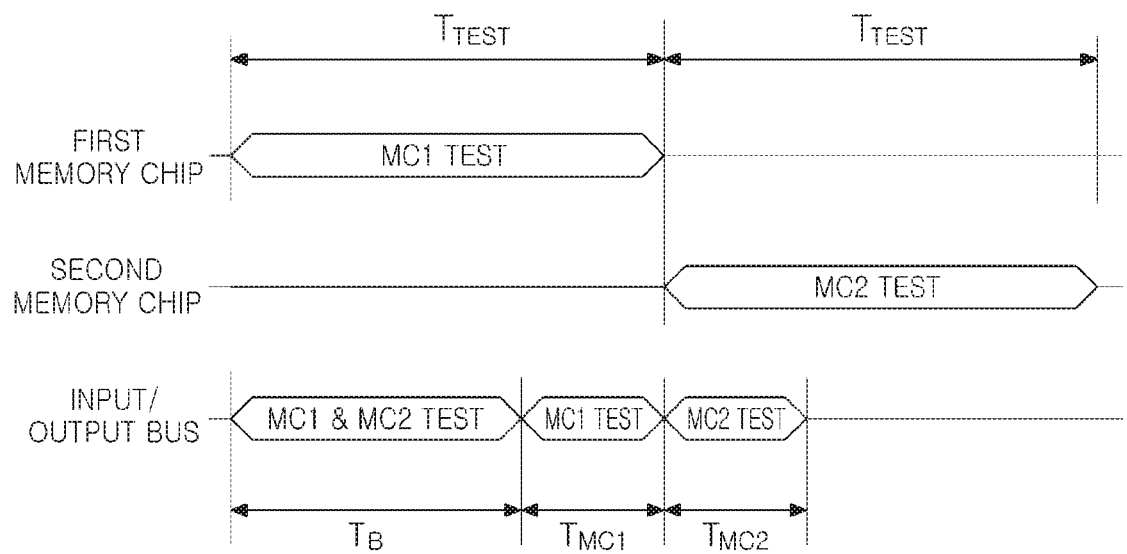

FIGS. 22 and 23 are views illustrating a test method of a memory device according to some example embodiments of the inventive concepts.

In some example embodiments of the inventive concepts illustrated in FIGS. 22 and 23, a test device may verify a memory chip using a plurality of test patterns during the test time TTEST. In this case, the possibility that the memory device is not correctly verified by only a single test process may be excluded.

First, referring to FIG. 22, a test process on a first memory chip and a second memory chip may be performed during the test time TTEST. According to a method according to the related art, during one test time TTEST, a test on a first memory chip may be conducted over a plurality of times. After the test on the first memory chip is completed, a test on a second memory chip may be conducted over a plurality of times during one test time TTEST. Thus, to test both the first memory chip and the second memory chip, the test time TTEST is required twice. Alternatively, during one test time TTEST, the first memory chip and the second memory chip are divided and tested, but a method of reducing the number of tests of each of the first memory chip and the second memory chip is required to be applied.

In some example embodiments of the inventive concepts, in a test process, the capacity of verification data, output by the first memory chip and the second memory chip, is reduced, so the problem described above may be solved. As described previously, in some example embodiments of the inventive concepts, in the reference time defined by a burst size, a test device may receive verification data, output by the first memory chip and the second memory chip. Thus, as illustrated in FIG. 22, within one test time TTEST, without decreasing the number of tests, the first memory chip and the second memory chip may be tested.

However, in some example embodiments of the inventive concepts, an amount of verification data is reduced. Compared to the method according to the related art, while a test process is performed, a circuit area, not used in a memory device, may be present. Thus, a test coverage problem may occur.

In some example embodiments of the inventive concepts, to reduce and/or prevent a test coverage problem from occurring, by mixing a method for using verification data of which an amount is reduced with a method according to the related art for outputting input data as it is, a test on a memory device may be conducted. Hereinafter, the following description will be made with reference to FIG. 23.

Referring to FIG. 23, in some example embodiments of the inventive concepts, a test device receives verification data, of which an amount is reduced, from the first memory chip and the second memory chip during the first test time TB, to verify the first memory chip and the second memory chip. In this case, the first test time TB may be the time shorter than the test time TTEST required to test a first memory chip with a particular (or, alternatively, predetermined) number of tests in a method according to the related art.

When the first test time TB has elapsed, a test device may verify a first memory chip using a method for receiving output data, corresponding to input data transmitted to the first memory chip, as it is for the second test time TMC1. When the second test time TMC1 has elapsed, the test device may verify a second memory chip using a method for receiving output data, corresponding to input data transmitted to the second memory chip, as it is for the third test time TMC2.

For example, assuming that the test device verifies each of the first memory chip and the second memory chip with 100 test patterns. In some example embodiments of the inventive concepts illustrated in FIG. 23, by using a method for receiving verification data, of which an amount is reduced, from the first memory chip and the second memory chip during the first test time TB, each of the first memory chip and the second memory chip may be verified with 90 test patterns. Meanwhile, during the second test time TMC1, the test device may verify the first memory chip with 10 test patterns using a method for receiving output data, corresponding to input data, as it is. During the third test time TMC2, the test device may verify the second memory chip with 10 test patterns using a method for receiving output data, corresponding to input data, as it is. Thus, a test process on the first memory chip and a second memory chip may be performed, while the total time required to test the first memory chip and the second memory chip is reduced, and a test coverage problem is significantly reduced.

As set forth above, according to example embodiments of the present inventive concepts, whether failure of a memory device occurs may be verified using parity data generated in a memory device during a process in which the memory device stores or outputs data. The parity data may be provided in an amount smaller than data stored or output in response to a write command or a read command by a memory device, so a larger number of memory devices may be tested during a limited time. Thus, efficiency of a test process may be increased, and productivity of a memory device may be improved.

While example embodiments have been shown and described above, it will be apparent to those skilled in the art that modifications and variations could be made without departing from the scope of the present disclosure, as defined by the appended claims.

What is claimed is:

1. A memory device, comprising:
a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor;
a write circuit configured to store input data received at the memory device from a test device in the bank array;
a read circuit configured to generate output data based on reading data stored in the bank array;
a parity data management circuit configured to
generate first parity data using the input data, the first parity data having a size smaller than the input data,
generate second parity data using the output data, the second parity data having a size smaller than the output data, and
generate third parity data using the first parity data and the second parity data; and
an output circuit configured to output at least one instance of data of the first parity data, the second parity data, and the third parity data as verification data, in response to a receipt of a request from the test device at the memory device.

2. The memory device of claim 1, wherein the parity data management circuit includes
a first error check code (ECC) engine configured to generate the first parity data based on the input data, and
a second ECC engine configured to generate the second parity data based on the output data.

3. The memory device of claim 2, wherein the parity data management circuit is configured to generate the third parity data based on XORing the first parity data and the second parity data for each bit.

4. The memory device of claim 3, further comprising:
a correction circuit configured to correct an error of the output data based on the third parity data.

5. The memory device of claim 2, wherein the output circuit is configured to output the first parity data and the third parity data as the verification data, in response to receipt of the request from the test device.

6. The memory device of claim 2, wherein the parity data management circuit is configured to generate the third parity data based on XORing bits included in the first parity data with the second parity data for each bit subsequently to the bits, included in the first parity data, being cyclically shifted by a particular offset.

7. The memory device of claim 6, wherein the output circuit is configured to output the third parity data in response to receipt of the request from the test device.

8. The memory device of claim 1, wherein the parity data management circuit is configured to
generate the first parity data based on selecting a portion of the input data, and
generate the second parity data based on performing ECC encoding on the output data.

9. The memory device of claim 8, wherein the parity data management circuit is configured to generate the third parity data based on XORing the first parity data and the second parity data for each bit.

10. The memory device of claim 9, wherein the output circuit is configured to output the third parity data as the verification data, in response to a request from the test device.

11. The memory device of claim 1, wherein
each of the input data and the output data includes 2N bits, where N is a natural number, and
each of the first parity data, the second parity data, and the third parity data includes N+1 bits.

12. The memory device of claim 1, wherein the bank array includes
a first memory area of memory cells configured to store the input data, and
a second memory area of memory cells configured to store the first parity data.

13. The memory device of claim 1, further comprising:
a first memory chip and a second memory chip, the first memory chip and the second memory chip sharing an input/output bus,
wherein each memory chip of the first memory chip and the second memory chip includes the write circuit, the read circuit, the parity data management circuit, and the output circuit.

14. The memory device of claim 13, wherein each memory chip of the first memory chip and the second memory chip is configured to output verification data in response to a request from the test device, such that the verification data is sequentially transmitted to the test device through the input/output bus during a time of outputting data corresponding to a burst size.

15. The memory device of claim 14, wherein
the second memory chip is configured to output a high impedance signal concurrently with the first memory chip outputting the verification data, and
the first memory chip is configured to output a high impedance signal concurrently with the second memory chip outputting the verification data.

16. The memory device of claim 1, wherein the output circuit is configured to output at least one instance of data of the first parity data, the second parity data, and the third parity data, as verification data over a plurality of times, and outputs the output data as verification data.

17. A memory device, comprising:
an input/output bus configured to provide a transmission path of data; and
a plurality of memory chips configured to share the input/output bus, each memory chip of the plurality of memory chips including
  a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor,
  a write circuit configured to store input data received at the memory chip from a test device through the input/output bus in the bank array,
  a read circuit configured to generate output data based on reading data stored in the bank array,
  a parity data management circuit configured to
    generate first parity data using the input data, the first parity data having a size smaller than the input data,
    generate second parity data using the output data, the second parity data having a size smaller than the output data, and
    generate third parity data using the first parity data and the second parity data, and
  an output circuit configured to output at least one instance of data of the first parity data, the second parity data, and the third parity data as verification data, in response to a receipt of a request from the test device at the memory chip, and
wherein, one memory chip of the plurality of memory chips is configured to output the verification data concurrently with a remaining plurality of memory chips of the plurality of memory chips outputting a high impedance signal.

18. The memory device of claim 17, wherein
each of the input data and the output data includes 2N bits, where N is a natural number, and
each of the first parity data, the second parity data, and the third parity data includes N+1 bits.

19. A memory device, comprising:
an input/output bus configured to provide a transmission path of data; and
a plurality of memory chips configured to share the input/output bus, each memory chip of the plurality of memory chips including
  a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor,
  a write circuit configured to receive input data having 2N bits, where N is a natural number, through the input/output bus and store the input data in the bank array,
  a read circuit configured to generate output data having 2N bits based on reading data stored in the bank array,
  a parity data management circuit configured to
    generate first parity data having N+1 bits using the input data,
    generate second parity data having N+1 bits using the output data, and
    generate third parity data having N+1 bits using the first parity data and the second parity data, and
  an output circuit configured to output at least one instance of data of the first parity data, the second parity data, and the third parity data as verification data, in response to a receipt of a request from a test device at the memory chip, and
wherein a total quantity of bits of the verification data, output by the plurality of memory chips in response to a request from the test device being received at the plurality of memory chips, is smaller than a quantity of bits defined by a burst size of the plurality of memory chips.

20. The memory device of claim 19, wherein a burst size of each of the plurality of memory chips includes $2^N$ bits.

* * * * *